United States Patent
Im et al.

(10) Patent No.: US 9,806,279 B2
(45) Date of Patent: Oct. 31, 2017

(54) ORGANIC LIGHT EMITTING DISPLAY DEVICE COMPRISING AUXILIARY ELECTRODE HAVING VOID THEREIN AND MANUFACTURING METHOD THEREOF

(71) Applicant: LG Display Co., Ltd., Seoul (KR)

(72) Inventors: JongHyeok Im, Busan (KR); SeJune Kim, Gyeonggi-do (KR); JoonSuk Lee, Seoul (KR); SoJung Lee, Gyeonggi-do (KR); JaeSung Lee, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/792,660

(22) Filed: Jul. 7, 2015

(65) Prior Publication Data

US 2016/0013438 A1    Jan. 14, 2016

(30) Foreign Application Priority Data

Jul. 8, 2014 (KR) .................. 10-2014-0085414
Jun. 25, 2015 (KR) .................. 10-2015-0090667

(51) Int. Cl.
*H01L 51/52* (2006.01)
*H01L 51/56* (2006.01)
*H01L 27/32* (2006.01)

(52) U.S. Cl.
CPC ...... *H01L 51/5228* (2013.01); *H01L 27/3279* (2013.01); *H01L 51/5206* (2013.01); *H01L 51/56* (2013.01); *H01L 27/3246* (2013.01); *H01L 51/5212* (2013.01); *H01L 2251/301* (2013.01); *H01L 2251/308* (2013.01)

(58) Field of Classification Search
CPC ............ H01L 27/3279; H01L 51/5212; H01L 51/5228
See application file for complete search history.

(56) References Cited

U.S. PATENT DOCUMENTS

2009/0009069 A1    1/2009  Takata et al.
2010/0244664 A1*   9/2010  Fujioka ............... H01L 27/3244
                                                          313/504

(Continued)

FOREIGN PATENT DOCUMENTS

| CN | 10340754 A | 1/2009 |
| CN | 103066212 A | 4/2013 |
| JP | 2008135325 A | 6/2008 |

OTHER PUBLICATIONS

English machine translation of JP2008-135325A of record.*

(Continued)

*Primary Examiner* — Marcos D Pizarro
*Assistant Examiner* — Christopher M Roland
(74) *Attorney, Agent, or Firm* — Morgan, Lewis & Bockius LLP

(57) ABSTRACT

Provided are an organic light emitting display device and a manufacturing method thereof. In the organic light emitting display device, after an auxiliary electrode having a multi-layer structure including different kinds of metals different in etching speed is formed, a void is formed within the auxiliary electrode upon formation of an anode. The resulting structure is created by a simplified process, with contact reliability between a cathode and the auxiliary electrode being enhanced, while resistance of the cathode is reduced.

15 Claims, 11 Drawing Sheets

(56) References Cited

U.S. PATENT DOCUMENTS

| | | | |
|---|---|---|---|
| 2012/0205700 A1* | 8/2012 | Tanada | H01L 27/3279 257/98 |
| 2013/0056784 A1* | 3/2013 | Lee | H01L 27/3246 257/99 |
| 2016/0013436 A1* | 1/2016 | Im | H01L 51/5206 257/40 |

OTHER PUBLICATIONS

Extended European Search Report dated Dec. 2, 2015, for corresponding European Patent Application No. 15175866.1.

First Notification of Office Action dated Aug. 22, 2017 from the State Intellectual Property Office of China in related Chinese Application No. 201510521118.3.

* cited by examiner

ORGANIC LIGHT EMITTING DISPLAY DEVICE COMPRISING AUXILIARY ELECTRODE HAVING VOID THEREIN AND MANUFACTURING METHOD THEREOF

CROSS-REFERENCE TO RELATED APPLICATION

Pursuant to 35 U.S.C. §119(a), this application claims the benefit of earlier filing date and right of priority to Korean Applications No. 10-2014-0085414, filed on Jul. 8, 2014, and No. 10-2015-0090667, filed on Jun. 25, 2015, the contents of which are incorporated by reference herein in its entirety.

BACKGROUND OF THE INVENTION

1. Field of the Invention

The present disclosure relates to an organic light emitting display device and a manufacturing method thereof, and particularly, to a top emission type organic light emitting display device and a manufacturing method thereof.

2. Background of the Invention

Recently, interest in information displays has been on the rise, demand for using portable information mediums has grown, and research into and commercialization of lighter, thinner flat panel displays (FPDs) has actively conducted.

In the flat panel display field, liquid crystal displays (LCDs) which are light in weight and consume less power have come to prominence.

Among display devices, an organic light emitting display device is self-luminous and thus it is excellent in terms of a viewing angle and a contrast ratio, compared with an LCD. Also, since the organic light emitting display device does not require a backlight, the organic light emitting display device may be lighter and thinner and is advantageous in terms of power consumption. In addition, the organic light emitting display device may be driven with a low DC voltage and may have a fast response speed.

Hereinafter, a basic structure and operational characteristics of an organic light emitting display device will be described in detail with reference to the accompanying drawings.

FIG. 1 is a diagram illustrating a light emitting principle of a general organic light emitting diode.

In general, an organic light emitting display device includes an organic light emitting diode (OLED) as illustrated in FIG. 1.

Referring to FIG. 1, an OLED includes an anode 18, a pixel electrode, a cathode 28, a common electrode, and organic compound layers 31, 32, 35, 36, and 37 formed between the anode 18 and the cathode 28.

Here, the organic compound layers 31, 32, 35, 36, and 37 include a hole injection layer 31, a hole transport layer 32, an emission layer 35, an electron transport layer 36, and an electron injection layer 37.

In the OLED configured thusly, when a positive (+) voltage and a negative (−) voltage are applied to the anode 18 and the cathode 28, respectively, holes passing through the hole transport layer 30b and electrons passing through the electron transport layer 30d are transferred to the emission layer 30c to form excitons, and when the excitons transition from an excited state to a ground state, namely, a stable state, to thus emit light.

In the organic light emitting display device, subpixels each including the OLED having the foregoing structure are arranged in a matrix form and selectively controlled with a data voltage and a scan voltage to display various colors that collectively form an image.

Here, the organic light emitting display device can be categorized into a passive matrix organic light emitting display device and an active matrix type organic light emitting display device using a thin film transistor (TFT) as a switching element. In the active matrix type organic light emitting display device, a TFT, an active element, is selectively turned on to select a subpixel and maintain light emission of the subpixel due to voltage charged in a storage capacitor.

Also, the organic light emitting display device having the foregoing subpixel structure may be implemented as a top emission type organic light emitting display device, a bottom emission type organic light emitting display device, or a dual-emission type organic light emitting display device according to directions in which light is emitted.

In the top emission type organic light emitting device emits light in a direction opposite to a substrate on which subpixels are arranged. The top emission type organic light emitting device is advantageous in that an aperture ratio is greater than that of the bottom emission type organic light emitting device in which light is emitted in a direction toward the substrate in which subpixels are arranged.

In the top emission type organic light emitting device, an anode is formed below an organic compound layer, and a cathode is formed above the organic compound layer in which light is transmitted.

Here, the cathode should be formed to be thin enough so as to be implemented as a translucent film having a low work function. However, doing so causes the cathode to have high resistance.

Thus, in the top emission type organic light emitting display device, voltage drop (IR drop) occurs due to the high resistivity of the thin structured cathode. Thus, voltages having different levels are applied to subpixels, causing non-uniformity of luminance or image quality. In particular, as the size of a display panel increases, the voltage drop problem may be aggravated.

SUMMARY OF THE INVENTION

Therefore, an aspect of the detailed description is to provide a top emission type organic light emitting display device in which a voltage drop of a cathode is prevented, while simplifying a process, and a manufacturing method thereof.

Another aspect of the detailed description is to provide an organic light emitting display device in which voltage drop of a cathode is prevented, while enhancing reliability of contact between a cathode and an auxiliary electrode, and a manufacturing method thereof.

Other objects and features not described herein will be described in constitution of the invention and claims described hereinafter.

To achieve these and other advantages and in accordance with the purpose of this specification, as embodied and broadly described herein, an organic light emitting display device includes: a first electrode disposed in each of a plurality of subpixels of a substrate; an auxiliary electrode spaced apart from the first electrode and having a void formed by at least two metal layers having different etching speed; and a second electrode in contact with the auxiliary electrode directly through the void.

In the auxiliary electrode, an etching speed of a metal in an upper layer is lower than that of a metal in a lower layer.

The upper layer includes at least one of ITO, Ag, Ag alloy, or MoTi.

The lower layer includes Cu.

At least one end portion of the upper layer protrudes, relative to that of the lower layer to form the void.

The second electrode is in contact with the end portion of the lower layer.

The second electrode is in contact with a rear surface of a protrusion of the upper layer.

The auxiliary electrode may further include a metal layer disposed in the lowermost layer below the lower layer.

At least one end portion of the lowermost layer protrudes, relative to at least one end portion of the upper layer to form the void.

The second electrode is in contact with an upper surface of a protrusion of the lowermost layer.

The lowermost layer includes Mo or MoTi.

A material of the upper layer is the same as a material of the first electrode.

The organic light emitting display device may further include a connection electrode below the first electrode and having a same structure as those of the metal layers disposed in the lowermost layer and the lower layer.

To achieve these and other advantages and in accordance with the purpose of this specification, as embodied and broadly described herein, a first electrode in each of a plurality of subpixels of a substrate; an auxiliary electrode spaced apart from the first electrode and including at least two layers, wherein an end portion of at least one layer below an upper layer is at an inner side than an end portion of the upper layer; an organic layer on the first electrode and the upper layer; and a second electrode on the organic layer and connected to the at least one layer.

The etching speed of an upper layer among the at least two layers of the auxiliary electrode is slower than that of the at least one other layer among the at least two layers.

The auxiliary electrode further includes a lowermost layer below the at least one other layer, wherein an end portion of the lowermost layer is at an outer side than the end portion of the upper layer.

An etching speed of the at least one other layer is faster than an etching speed of all other layers.

To achieve these and other advantages and in accordance with the purpose of this specification, as embodied and broadly described herein, a method for manufacturing an organic light emitting display device includes: forming a driving thin film transistor (TFT) on a substrate; forming an auxiliary electrode pattern including at least two different metal layers on the substrate; patterning a first electrode on the substrate with the auxiliary electrode pattern formed thereon, wherein the auxiliary electrode pattern is etched when the patterning is performed, to form the auxiliary electrode including the at least two different metal layers; forming an organic layer on the first electrode and the auxiliary electrode; and forming a second electrode on the organic layer, wherein when the patterning is performed, at least one metal layer on another metal layer disposed in a lowermost layer is more etched, wherein an end portion of the at least one metal layer is disposed at an inner side than an end portion of the other metal layer disposed in the lowermost layer to form a void, wherein the second electrode and the auxiliary electrode are in direct contact with each other through the void.

The second electrode is formed to be in direct contact with an upper surface of the another metal layer and a side surface of the at least one metal layer.

According to the organic light emitting display device and a manufacturing method thereof of embodiments of the present disclosure, an auxiliary electrode having a multi-layer structure including different kinds of metals different in etching speed is formed, and when an anode is formed, a void is formed within the auxiliary electrode such that the auxiliary electrode is in direct contact with a cathode. Thus, resistance of the cathode may be reduced, while the process is simplified.

According to the organic light emitting display device and a manufacturing method thereof of embodiments of the present disclosure, defects may be reduced to enhance productivity, and luminance uniformity and reliability of the organic light emitting display device may be enhanced.

Further scope of applicability of the present application will become more apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
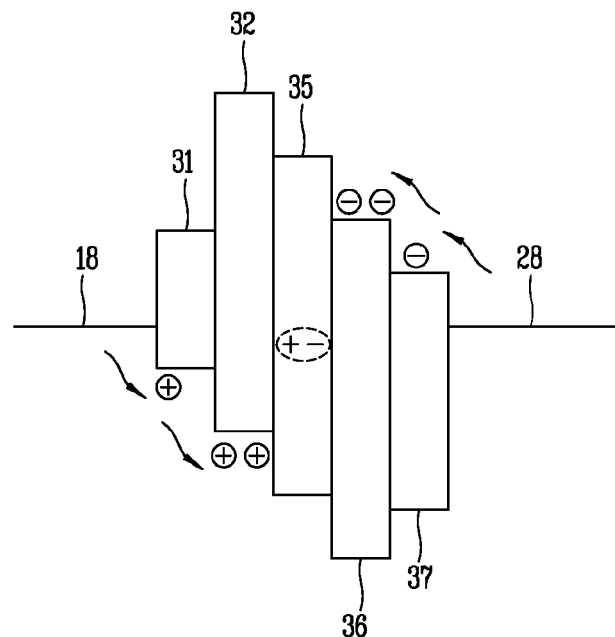
FIG. 1 is a diagram illustrating a principle of light emission of a general organic light emitting diode (OLED).

Hereinafter, an organic light emitting display device and a method of manufacturing the same according to embodiments will be described in detail with reference to the accompanying drawings such that they can be easily practiced by those skilled in the art to which the present disclosure pertains.

The advantages and features of the present disclosure and methods for achieving these will be clarified in detail through embodiments described hereinafter in conjunction with the accompanying drawings. However, embodiments of the present disclosure may, however, be implemented in many different forms and should not be construed as being limited to the embodiments set forth herein. Rather, these embodiments are provided so that this disclosure will be thorough and complete, and will fully convey the scope of the invention to those skilled in the art and are defined by the claim coverage of the present disclosure. Throughout the specification, the same reference numerals will be used to designate the same or like components. In the drawings, the sizes or shapes of elements may be exaggeratedly illustrated for clarity and convenience of description.

It will be understood that when an element or layer is referred to as being "on" or "connected to" another element or layer, it can be directly on or directly connected to the other element or layer, or intervening elements or layers may be present.

Relative terms, such as lower or "bottom" and "upper" or "top," may be used herein to describe relationship of one or more elements to another elements as illustrated in the Figures. It will be understood that relative terms are intended to encompass different orientations of the device in addition to the orientation depicted in the Figures. For example, if a device in the Figures is turned over, elements described as being on the "lower" side of other elements would then be oriented on "upper" sides of the other elements. The exemplary term "lower," can therefore, encompasses both an orientation of "lower and "upper," depending of the particular orientation of the figure. Similarly, if the device in one of the figures is turned over, elements described as "below" or beneath" other elements would then be oriented "above" the other elements. The terms "below" or "beneath" can therefore encompass both an orientation of above and below.

The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
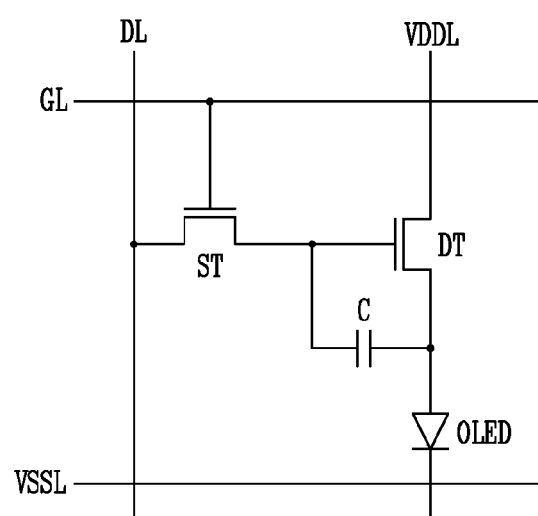
FIG. 2 is a view illustrating a structure of a subpixel of an organic light emitting display device.

FIG. 2 is a view illustrating a structure of a subpixel of an organic light emitting display device.

Referring to FIG. 2, in the organic light emitting display device, a subpixel region is defined by a gate line GL arranged in a first direction and a data line DL and a driving power line VDDL arranged to be spaced apart from one another in a second direction intersecting the first direction.

The single subpixel region may include a switching thin film transistor (TFT) ST, a driving thin film transistor (TFT) DT, a storage capacitor C, and an OLED.

The switching TFT ST is switched according to a gate signal supplied to the gate line GL to supply a data signal supplied to the data line DL, to the driving TFT DT.

The driving TFT DT is switched according to the data signal supplied from the switching TFT ST to control a current flowing from the driving power line VDDL to the OLED.

The storage capacitor C is connected between a gate electrode of the driving TFT DT and a base power line VSSL, stores a voltage corresponding to the data signal supplied to the gate electrode of the driving TFT DT, and uniformly maintains a turn-on state of the driving TFT DT with the stored voltage during one frame.

The OLED is electrically connected between a source electrode or a drain electrode of the driving TFT DT and the base power line VSSL and emits light by a current corresponding to a data signal supplied from the driving TFT DT.

Figure 3:
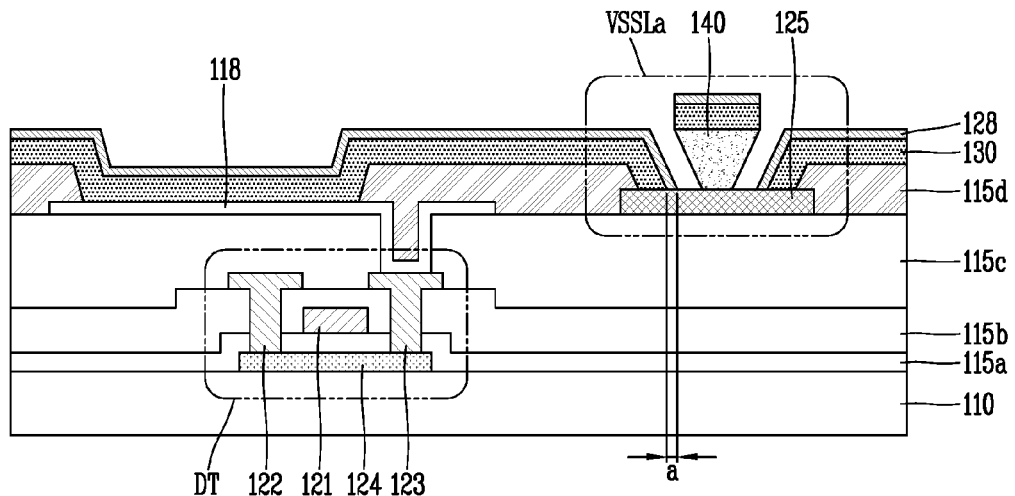
FIG. 3 is a cross-sectional view schematically illustrating a portion of a structure of an organic light emitting display device according to a first embodiment of the present disclosure.
Figure 4:
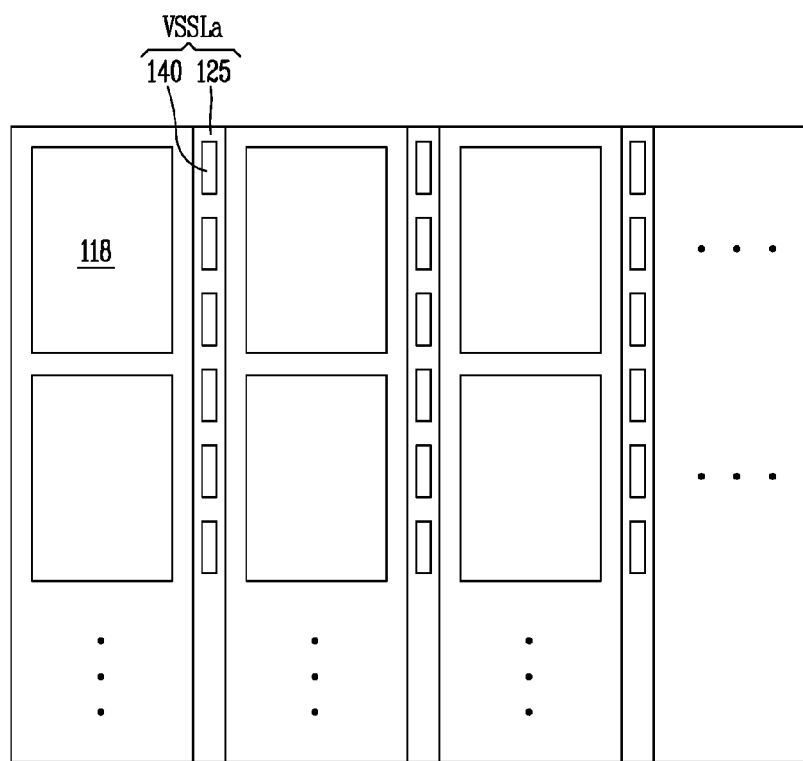
FIG. 4 is a plan view schematically illustrating a portion of a pixel unit of an organic light emitting display device according to the first embodiment of the present disclosure.

FIG. 3 is a cross-sectional view schematically illustrating a portion of a structure of an organic light emitting display device according to a first embodiment of the present disclosure, and FIG. 4 is a plan view schematically illustrating a portion of a pixel unit of an organic light emitting display device according to the first embodiment of the present disclosure.

Here, FIG. 3 illustrates a top emission type organic light emitting display device using a TFT having a coplanar structure as an example. However, the present disclosure is not limited to the TFT having a coplanar structure.

Referring to FIGS. 3 and 4, the top emission type organic light emitting display device includes a substrate 110, a driving thin film TFT DT, an organic light emitting diode (OLED), and an auxiliary electrode line VSSLa.

First, the driving TFT DT includes a semiconductor layer 124, a gate electrode 121, a source electrode 122, and a drain electrode 123.

The semiconductor layer 124 is formed on the substrate 110 formed of an insulating material such as transparent plastic or a polymer film.

The semiconductor layer 124 may be formed of an amorphous silicon film, a polycrystalline silicon film formed by crystallizing amorphous silicon, an oxide semiconductor, or an organic semiconductor.

Here, a buffer layer (not shown) may be further formed between the substrate 110 and the semiconductor layer 124. The buffer layer may be formed to protect a TFT formed in a follow-up process from impurities such as alkali ions leaked from the substrate 110.

A gate insulating layer 115a formed of a silicon nitride film (SiNx) or a silicon oxide film ($SiO_2$) is formed on the semiconductor layer 124. A gate line (not shown) including the gate electrode 121 and a first storage electrode (not shown) are formed on the gate insulating layer 115a.

The gate electrode 121, the gate line, and the first storage electrode may be formed as a single layer or a multi-layer formed of a first metal having low resistivity characteristics, for example, aluminum (Al), copper (Cu), molybdenum (Mo), chromium (Cr), gold (Au), titanium (Ti), nickel (Ni), neodymium (Nd), or an alloy thereof.

An inter-insulation layer 115b formed of a silicon nitride film or a silicon oxide film is formed on the gate electrode 121, the gate line, and the first storage electrode. Also, a data line (not shown), a driving voltage line (not shown), source/drain electrodes 122 and 123, and a second storage electrode (not shown) are formed on the inter-insulation layer 115b.

The source electrode 122 and the drain electrode 123 are formed to be spaced apart from one another and electrically connected to the semiconductor layer 124. In detail, a semiconductor layer contact hole exposing the semiconductor layer 124 is formed in the gate insulating layer 115a and the inter-insulation layer 115b, and the source and drain electrodes 122 and 132 are electrically connected to the semiconductor layer 124 through the semiconductor layer contact hole.

Here, the second storage electrode overlaps a portion of the first storage electrode therebelow with the inter-insulation layer 115b interposed therebetween, forming a storage capacitor.

The data line, the driving voltage line, the source and drain electrodes 122 and 123, and the second storage electrode may be formed as a single layer or a multi-layer formed of a second metal having low resistivity characteristics, for example, aluminum (Al), copper (Cu), molybdenum (Mo), chromium (Cr), gold (Au), titanium (Ti), nickel (Ni), neodymium (Nd), or an alloy thereof.

A planarization film 115c formed of a silicon nitride film or a silicon oxide film is formed on the substrate 110 on which the data line, the driving voltage line, the source and drain electrodes 122 and 123, and the second storage electrode have been formed.

The OLED may include a first electrode 118, an organic compound layer 130, and a second electrode 128.

The OLED is electrically connected to the driving TFT DT. In detail, a drain contact hole exposing the drain electrode 123 of the driving TFT DT is formed in the planarization film 115c formed on the driving TFT DT. The OLED is electrically connected to the drain electrode 123 of the driving TFT DT through the drain contact hole.

That is, the first electrode 118 is formed on the planarization film 115c, and electrically connected to the drain electrode 123 of the driving TFT DT through the drain contact hole.

The first electrode 118 supplies a current (or a voltage) to the organic compound layer 130. Also, the first electrode 118 serves as an anode. Thus, the first electrode 118 may include a transparent conductive material having a relatively large work function. For example, the first electrode 118 may include indium tin oxide (ITO) or indium zinc oxide (IZO). In order to enhance reflection efficiency, the first electrode 118 may further include a reflective layer (not shown) formed of a metal having high reflection efficiency in a lower portion thereof. For example, the metal having high reflection efficiency may include aluminum (Al), silver (Ag), gold (Au), platinum (Pt), chromium (Cr), or an alloy thereof.

A bank 115d is formed on the substrate 110 with the first electrode 118 formed thereon. Here, the bank 115d may surround the periphery of the first electrode 118 to define a first opening, and may be formed of an organic insulating material or an inorganic insulating material. The bank 115d may also be formed of a photosensitizer including black pigment, and in this case, the bank 115d may serve as a light blocking member.

Here, in the first embodiment of the present disclosure, the bank 115d may further include a second opening exposing a portion of an auxiliary electrode 125 (to be described hereinafter).

The organic compound layer 130 is formed between the first electrode and the second electrode 128. The organic compound layer 130 emits light according to combination of holes supplied from the first electrode 118 and electrons supplied from the second electrode 128.

Here, in FIG. 3, it is illustrated that the organic compound layer 130 is formed on the entire surface of the substrate 110, but the present disclosure is not limited thereto. The organic compound layer 130 may be formed only on the first electrode 118.

The organic compound layer 130 may have a multilayer structure including an auxiliary layer for enhancing luminous efficiency of the emission layer, in addition to the emission layer emitting light.

The second electrode 128 is formed on the organic compound layer 130 to provide electrons to the organic compound layer 130.

The second electrode 128 serves as a cathode. Thus, the second electrode 128 may be formed of a transparent conductive material. For example, the transparent conductive material may include indium tin oxide (ITO) or indium zinc oxide (IZO). The second electrode 128 may further include a thin metal film formed of a metal having a low work function in a portion thereof in contact with the organic compound layer 130. For example, the metal having a low work function may include magnesium (Mg), silver (Ag), or a compound thereof.

In the case of the top emission type, the second electrode 128 is formed to have a small thickness in order to satisfy the requirements of the low work function and translucency. Thus, the second electrode 128 has high resistance, and due to the high resistance, a voltage drop (IR drop) occurs.

This, in the first embodiment of the present disclosure, in order to reduce resistance of the second electrode 128, the auxiliary electrode line VSSLa and the first electrode 118 may be formed on the planarization film 115c. That is, the auxiliary electrode line VSSLa and the first electrode 118 may be formed on the same layer. Also, the auxiliary electrode line VSSLa may include an auxiliary electrode 125 and a spacer 140.

The auxiliary electrode 125 may be formed to be spaced from the first electrode 118 on the same layer. As can be seen from FIG. 4, for example, the auxiliary electrode 125 may extend in a vertical direction so as to be connected to an external VSS pad.

The auxiliary electrode 125 may be formed of the same material as that of the first electrode 118, but the present disclosure is not limited thereto.

The auxiliary electrode 125 is connected to the second electrode 128. Here, an electrode contact hole exposing the auxiliary electrode 125 is formed in the organic compound layer 130 positioned in the second opening.

The spacer 140 is formed on the auxiliary electrode 125. Here, the spacer 140 may have a reverse taper shape in which a cross-sectional area is reduced downwardly (i.e. towards the substrate). Here, an angle between a side surface of the spacer 140 and the auxiliary electrode 125 may range from 20 degrees to 80 degrees, but the present disclosure is not limited thereto.

The spacer 140 forms an electrode contact hole exposing the auxiliary electrode 125 in the organic compound layer 130. Due to a shading effect, the organic compound layer 130 is formed only on the spacer 140 and is not formed on an exposed surface of the auxiliary electrode 125 below the spacer 140. That is, the organic compound layer 130 is deposited on the substrate 110 through evaporation, and due to the spacer 140 having a reverse taper shape, the organic compound layer 130 is not formed below the spacer 140. Thus, an electrode contact hole in which the auxiliary electrode 125 and the second electrode 128 are connected to the organic compound layer 130 is formed.

The organic compound layer 130 and the second electrode 128 are sequentially stacked on the spacer 140.

In the organic light emitting display device according to the first embodiment of the present disclosure, a contact area (a) in which the second electrode 128 and the auxiliary electrode 125 are connected may be limited. In particular, it may be difficult to implement a scheme of using an evaporation mask to form the organic compound layer 130 with respect to a large panel. This is because the second electrode 128 and the auxiliary 125 are placed in contact with each other after the organic compound layer 130 is deposited, and here, since the auxiliary electrode 125 is formed, the organic compound layer 130 is deposited on the entire surface, and the second electrode 128 is then deposited. Thus, the contact area (a) may be limited.

Thus, in a second embodiment and a third embodiment of the present disclosure, after an auxiliary electrode having a multilayer structure including different kinds of metals having different etching speeds (or etch rates), a void (or other type of space or clearance) is formed within the auxiliary electrode when an anode is formed, so that the auxiliary electrode can be in direct contact with a cathode. Accordingly, the process may be simplified and resistance of the cathode may be reduced. This will be described in detail with reference to the accompanying drawings.

Figure 5:
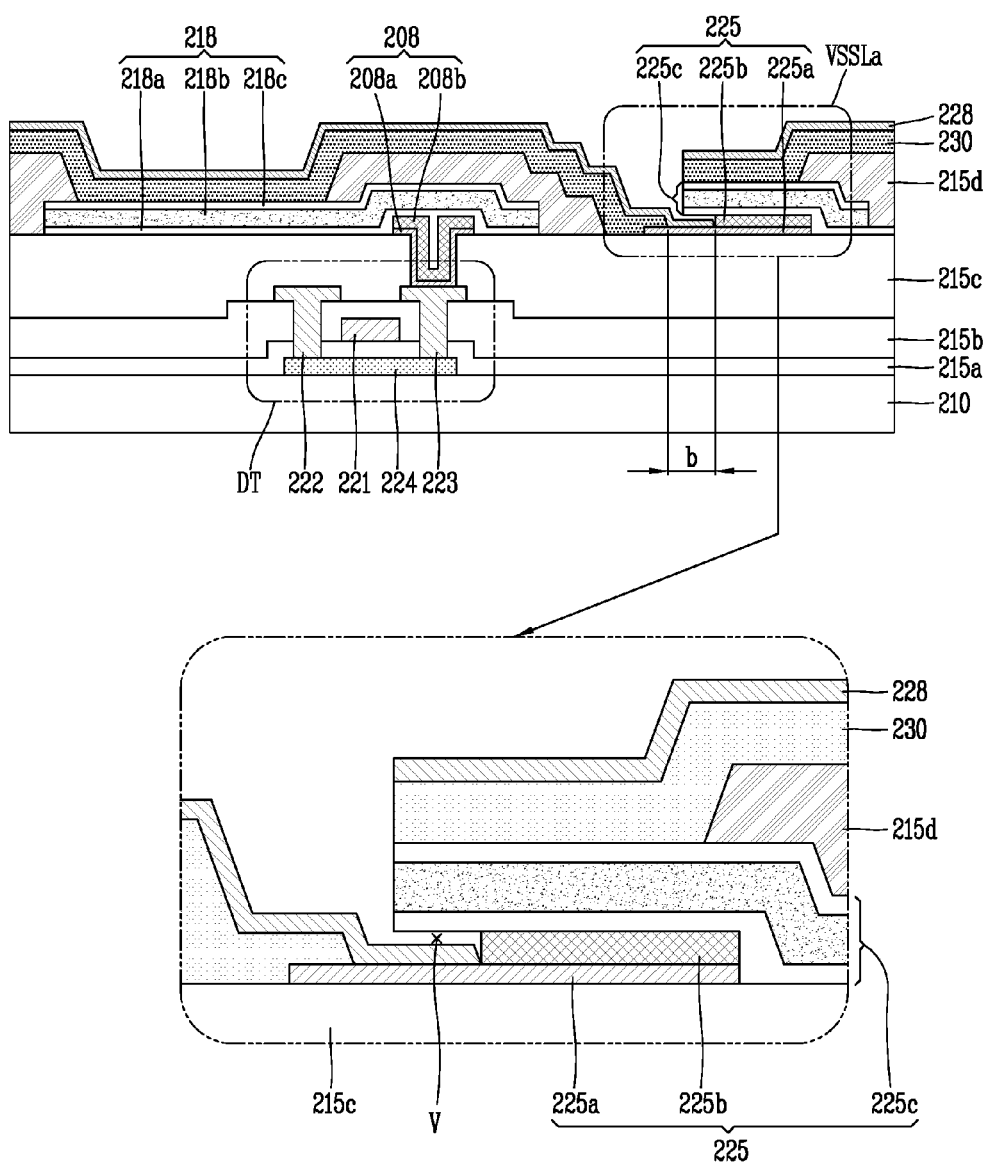
FIG. 5 is a cross-sectional view schematically illustrating a portion of a structure of an organic light emitting display device according to a second embodiment of the present disclosure.

FIG. 5 is a cross-sectional view schematically illustrating a portion of a structure of an organic light emitting display device according to a second embodiment of the present disclosure.

Here, FIG. 5 illustrates a top emission type organic light emitting display device using a TFT having a coplanar structure. However, the present disclosure is not limited to the TFT having a coplanar structure.

Referring to FIG. 5, the top emission type organic light emitting display device according to the second embodiment may include a substrate 210, a driving TFT DT, an OLED, and an auxiliary electrode line VSSLa.

Like that of the first embodiment described above, the driving TFT DT according to the second embodiment includes a semiconductor layer 224, a gate electrode 221, a source electrode 222, and a drain electrode 223.

The semiconductor layer 224 is formed on the substrate 210 formed of an insulating material such as transparent plastic or a polymer film.

The semiconductor layer 224 may be formed of an amorphous silicon film, a polycrystalline silicon film formed by crystallizing amorphous silicon, an oxide semiconductor, or an organic semiconductor.

Here, a buffer layer may be further formed between the substrate 210 and the semiconductor layer 224. The buffer layer may be formed to protect a TFT, which is formed in a follow-up process, from impurities such as alkali ions leaked from the substrate 210.

A gate insulating layer 215a formed of a silicon nitride film (SiNx) or a silicon oxide film (SiO$_2$) is formed on the semiconductor layer 224. A gate line including the gate electrode 221 and a first storage electrode are formed on the gate insulating layer 215a.

The gate electrode 221, the gate line, and the first storage electrode may be formed as a single layer or a multi-layer formed of a first metal having low resistivity characteristics, for example, aluminum (Al), copper (Cu), molybdenum (Mo), chromium (Cr), gold (Au), titanium (Ti), nickel (Ni), neodymium (Nd), or an alloy thereof.

An inter-insulation layer 215b formed of a silicon nitride film or a silicon oxide film is formed on the gate electrode 221, the gate line, and the first storage electrode. Also, a data line, a driving voltage line, source/drain electrodes 222 and 223, and a second storage electrode are formed on the inter-insulation layer 215b.

The source electrode 222 and the drain electrode 223 are formed to be spaced apart from one another and electrically connected to the semiconductor layer 224. Here, a semiconductor layer contact hole exposing the semiconductor layer 224 is formed in the gate insulating layer 215a and the inter-insulation layer 215b, and the source and drain electrodes 222 and 232 are electrically connected to the semiconductor layer 224 through the semiconductor layer contact hole.

Here, the second storage electrode overlaps a portion of the first storage electrode therebelow with the inter-insulation layer 215b interposed therebetween, thus forming a storage capacitor.

The data line, the driving voltage line, the source and drain electrodes 222 and 223, and the second storage electrode may be formed as a single layer or a multi-layer formed of a second metal having low resistivity characteristics, for example, aluminum (Al), copper (Cu), molybdenum (Mo), chromium (Cr), gold (Au), titanium (Ti), nickel (Ni), neodymium (Nd), or an alloy thereof.

A planarization film 215c formed of a silicon nitride film or a silicon oxide film is formed on the substrate 210 on which the data line, the driving voltage line, the source and drain electrodes 222 and 223, and the second storage electrode have been formed.

The OLED may include a first electrode 218, an organic compound layer 230, and a second electrode 228.

The OLED is electrically connected to the driving TFT DT. In detail, a drain contact hole exposing the drain electrode 223 of the driving TFT DT is formed in the planarization film 215c formed on the driving TFT DT. The OLED is electrically connected to the drain electrode 223 of the driving TFT DT through the drain contact hole.

That is, the first electrode 218 is formed on the planarization film 215c, and electrically connected to the drain electrode 223 of the driving TFT DT through a connection electrode 208 and the drain contact hole.

The first electrode 218 supplies a current (or a voltage) to the organic compound layer 230, which defines a light emitting region having a predetermined area. Also, the first electrode 218 serves as an anode. Thus, the first electrode 218 may include a transparent conductive material having a relatively large work function. For example, the first electrode 218 may include upper and lower layer first electrodes 218c and 218a formed of indium tin oxide (ITO) or indium zinc oxide (IZO). In order to enhance reflection efficiency, the first electrode 218 may further include a reflective layer 218b formed of a metal having high reflection efficiency in a lower portion thereof. For example, the metal having high reflection efficiency may include aluminum (Al), silver (Ag), gold (Au), platinum (Pt), chromium (Cr), or an alloy thereof.

Thus, the first electrode 218 according to the second embodiment of the present disclosure may have a triple-layer structure including the upper and lower layer first electrodes 218c and 218a and the reflective layer 218b between the upper layer first electrode 218c and the lower layer first electrode 218a. However, the present disclosure is not limited thereto.

A bank 215d is formed on the substrate 210 with the first electrode 218 formed thereon. Here, the bank 215d may surround the periphery of the first electrode 218 to define a first opening, and may be formed of an organic insulating material or an inorganic insulating material. The bank 215d may also be formed of a photosensitizer including black pigment, and in this case, the bank 215d may serve as a light blocking member.

Here, in the second embodiment of the present disclosure, the bank 215d may further include a second opening exposing a portion of an auxiliary electrode 225 (to be described hereinafter).

Here, the auxiliary electrode 225 according to the second embodiment of the present disclosure includes upper and lower layer auxiliary electrodes 225c and 225b, and the lowermost auxiliary electrode 225a. Here, the upper and lower layer auxiliary electrodes 225b and 225a can be made of different kinds of metals having different etching speeds (or etch rates) with respect to an etchant of the first electrode 218. Also, when the second electrode 228 is deposited, the second electrode 228 is in contact with the auxiliary electrode 225 itself.

For reference, the etching speed may be defined by a thickness or an amount by which a material is dissolved per unit hour, and etching speed of two materials may be relatively compared so as to be expressed as an etch ratio. When an etch ratio between two materials is expressed, it may be considered that as an etching speed is faster, an etch ratio is high.

However, the present disclosure is not limited thereto and the auxiliary electrode 225 according to the second embodiment of the present disclosure may have at least two or more layers including the upper and lower auxiliary electrodes 225c and 225b of different kinds of metals, and the lower auxiliary electrode 225b may be disposed at an inner side, relative to the upper layer auxiliary electrode 225c.

To this end, the upper, lower and the lowermost auxiliary electrodes 225c, 225b, and 225a are formed of a minimum of three or more metals, and etching speeds of the metals forming the lower layer and the lowermost layer auxiliary electrodes 225b and 225c are different with respect to an etchant used for patterning the upper layer auxiliary electrode 225c and the first electrode 218.

That is, the lowermost auxiliary electrode 225a may be formed of a metal that is not etched when the first electrode 218 is patterned, like MoTi or Ti. For example, the lowermost auxiliary electrode 225a may be formed of a metal without damaging an etchant of an Ag alloy. However, the present disclosure is not limited thereto and the lowermost auxiliary electrode 225a may be formed of a metal which may be etched at a relatively slow pace when the first electrode 218 is patterned.

In order to pattern the first electrode 218 formed of an Ag alloy, a phosphoric acid-based etchant, a nitric acid-based etchant, a phosphoric acid+nitric acid-based etchant, a phosphoric acid+acetic acid-based etchant, a nitric acid+acetic acid-based etchant, or a phosphoric acid+nitric acid+aetic acid-based etchant may be used.

For reference, Ag may be etched by phosphate or a nitrate anion (according to the following chemical reactions) so as to be precipitated.

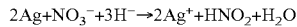

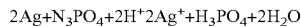

MoTi cannot be etched by the etchant of the Ag or Ag alloy. In case of MoTi or Ti, a component of $H_2O_2$, F is required to be included in the etchant in order to perform the desired etching process.

An oxidation process with respect to $H_2O_2$-based materials (or $H_2O_2$ group) is as follows.

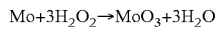

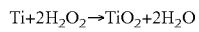

And, $MoO_3$ and $TiO_2$ are dissolved and etched by $F^-$ ions as follows.

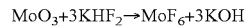

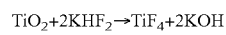

The lower layer auxiliary electrode 225b is formed of a metal which is etched at the fastest pace (or which has the highest etch rate), like copper (Cu), and thus, the lower layer auxiliary electrode 225b is etched by the etchant of Ag alloy relatively quickly.

The upper layer auxiliary electrode 225c may have the same triple-layer structure as that of the first electrode 218, and may be patterned at the same etching speed when the first electrode 218 is patterned. For example, metal layers constituting the upper layer auxiliary electrode 226c may include at least one of ITO, Ag, an Ag alloy, and MoTi.

Under the aforementioned etch conditions, when the ITO/Ag alloy/ITO is etched, MoTi of the lowermost layer auxiliary electrode 225a is not etched, while Cu of the lower layer auxiliary electrode 225b is etched faster than the ITO/Ag alloy/ITO. Also, the ITO/Ag alloy/ITO of the upper layer auxiliary electrode 225c is etched at the same speed as that of the first electrode 218, forming a predetermined void V within the auxiliary electrode 225.

When the organic compound layer 230 is deposited through evaporation in a follow-up process, the organic compound layer 230 is not deposited within the void V. Meanwhile, when a metal for the second electrode 228 is deposited through sputtering, the metal for the second electrode 228 is deposited within the void V to have a relatively large contact region (b), and the second electrode 228 is in contact with the auxiliary electrode 225.

Here, since the upper layer auxiliary electrode 225c is patterned to expose a portion of the lowermost layer auxiliary electrode 225a, the second electrode 228 and the auxiliary electrode 225 may smoothly contact with each other. That is, one end portion of the upper layer auxiliary electrode 225c may protrude relative to one end portion of the lower layer auxiliary electrode 225b, forming the void V, and one end portion of the lowermost layer auxiliary electrode 225a may protrude relative to one end portion of the lower layer auxiliary electrode 225b, forming the void V.

The dual-layer structure of CuMoTi in the multi-layer structure of the auxiliary electrode 225 may also be applied to the connection electrode 208 and a pad electrode. Thus, the connection electrode 208 may include upper and lower layer connection electrodes 208b and 208a Here, in FIG. 5, a case in which the connection electrode 208 is formed limitedly on the drain electrode 223 is illustrated as an example, but the present disclosure is not limited thereto. The connection electrode 208 of the present disclosure may be formed across the entire light emitting region substantially in the same form as that of the first electrode 218.

In this manner, according to the second embodiment of the present disclosure, when the first electrode 218 is patterned, the void V is formed within the auxiliary electrode 225 due to the differences in etching speed of the upper and lower layer and the lowermost layer auxiliary electrodes 225c, 225b, and 225a, and thus, the second electrode 228 and the auxiliary electrode 225 may be in direct contact in a relatively large contact region (b). In particular, since the side surface of the lower layer auxiliary electrode 225b, as well as the surface of the lowermost layer auxiliary electrode 225a, are used as the contact region (b), the reliability of contact may be enhanced. Also, the second electrode 228 may be configured to be in contact with a rear surface of the protrusion portion of the upper layer auxiliary electrode 225c.

Also, unlike that of the first embodiment of the present disclosure, in the organic light emitting display device according to the second embodiment of the present disclosure, the second electrode 228 and the auxiliary electrode 225 are in direct contact with each other, and thus, the number of masks needed during fabrication may be reduced.

That is, as described above, since the second electrode for the top emission type organic light emitting display device is implemented to have a large area, the overall luminance of a panel may not be as uniform as desired. In order to complement this, an auxiliary electrode is required, but when an organic compound layer is deposited, the organic compound is also deposited on the auxiliary electrode, hampering the necessary contact between the second electrode and the auxiliary electrode. In order solve this problem, a structure assisting the contact between the second electrode and the auxiliary electrode may be desirable, but such results in an increase in the number of masks and processes.

In contrast, in the organic light emitting display device according to the second embodiment of the present disclosure, when the first electrode 218 is patterned, the void V is formed within the auxiliary electrode 225 such that the second electrode 228 and the auxiliary electrode 225 are in direct contact with each other, thereby simplifying the process and reducing resistance of the second electrode 228. The reduction in resistance may make a current supplied to each subpixel within the panel to be more uniform, and thus, the overall uniformity of luminance may be enhanced for the panel.

Like that of the first embodiment of the present disclosure described above, the organic compound layer 230 is formed between the first electrode 218 and the second electrode 228. The organic compound layer 230 emits light according to combination of holes supplied from the first electrode 218 and electrons supplied from the second electrode 228.

Here, FIG. 5 illustrates a case in which the organic compound layer 230 is formed on the entire surface of the substrate 210, but the present disclosure is not limited thereto. The organic compound layer 230 may be formed only on the first electrode 218.

The organic compound layer 230 may have a multilayer structure including an auxiliary layer for enhancing luminous efficiency of the emission layer, in addition to the emission layer emitting light.

The second electrode 228 is formed on the organic compound layer 230 to provide electrons to the organic compound layer 230.

The second electrode 228 serves as a cathode. Thus, the second electrode 228 may be formed of a transparent conductive material. For example, the transparent conductive material may include indium tin oxide (ITO) or indium zinc oxide (IZO). The second electrode 228 may further include a thin metal film formed of a metal having a low work function in a portion thereof in contact with the organic compound layer 230. For example, the metal having a low work function may include magnesium (Mg), silver (Ag), and a compound thereof.

Hereinafter, a method for manufacturing the light emitting display device according to the second embodiment of the present disclosure described above will be described in detail with reference to the accompanying drawings.

FIGS. 6A through 6E are cross-sectional views sequentially illustrating a method of manufacturing an organic light emitting display device according to the second embodiment of the present disclosure illustrated in FIG. 5.

Figure 6A:
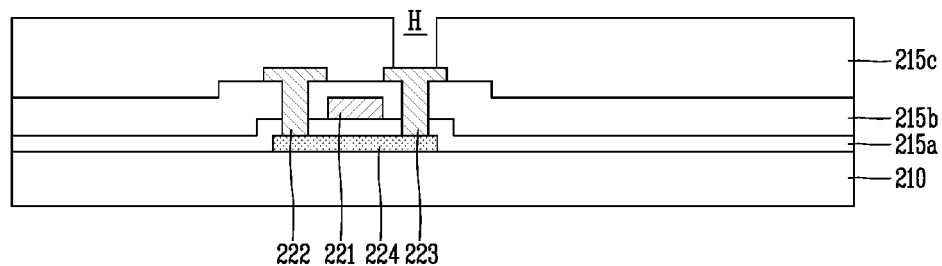
FIGS. 6A through 6E are cross-sectional views sequentially illustrating a method of manufacturing an organic light emitting display device according to the second embodiment of the present disclosure illustrated in FIG. 5.
Figure 6B:
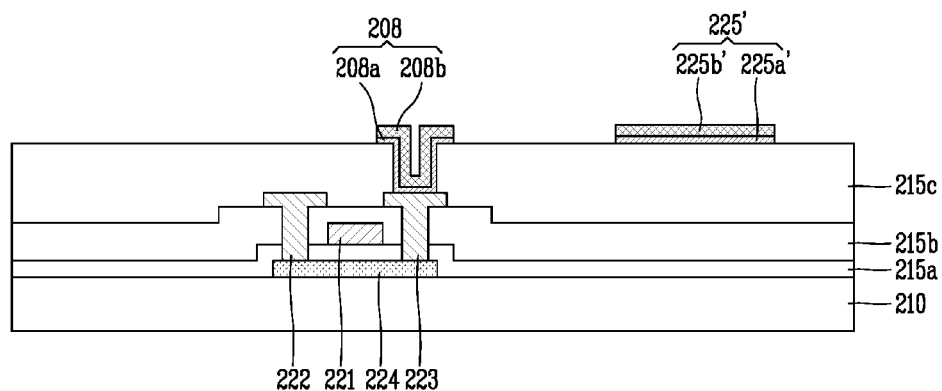
Figure 6C:
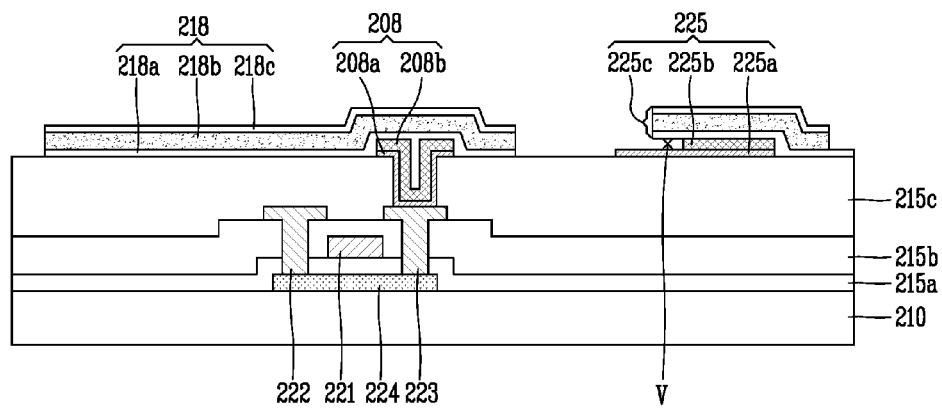
Figure 7A:
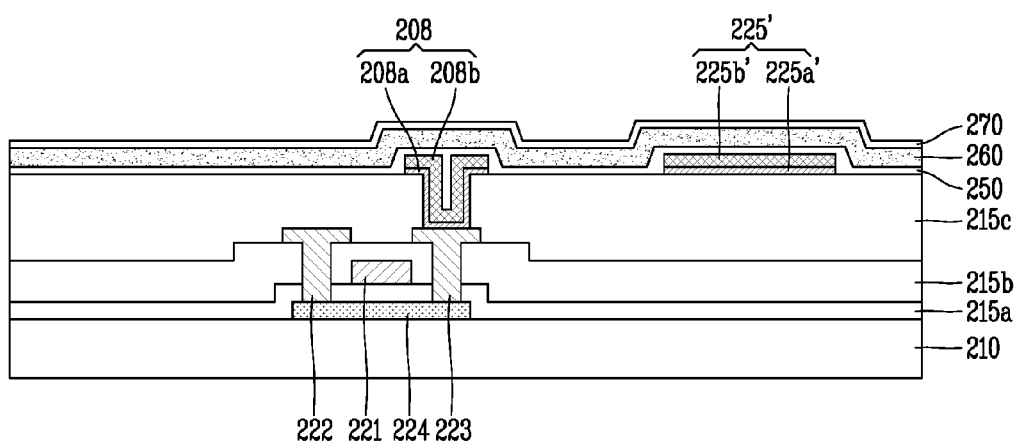
FIGS. 7A through 7C are cross-sectional views specifically illustrating a masking process illustrated in FIG. 6C.
Figure 7B:
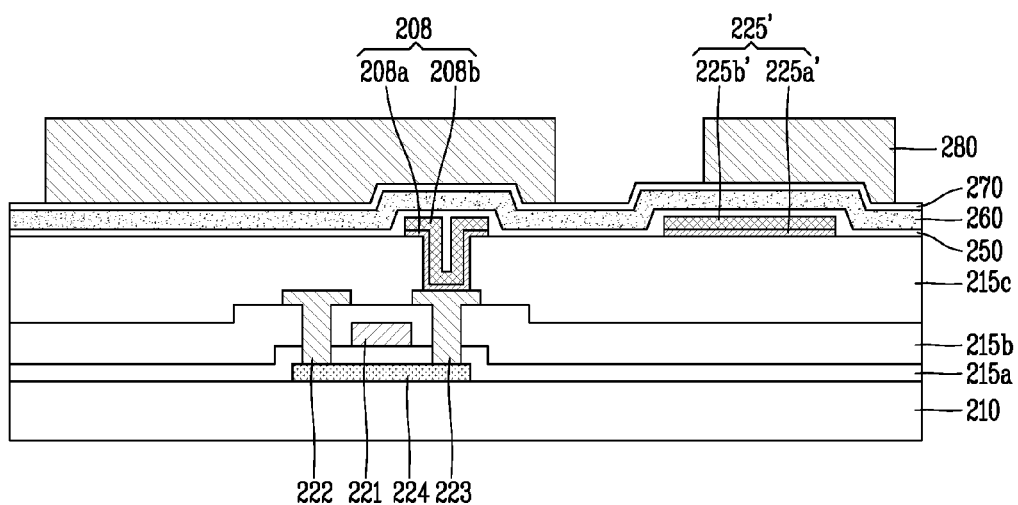
Figure 7C:
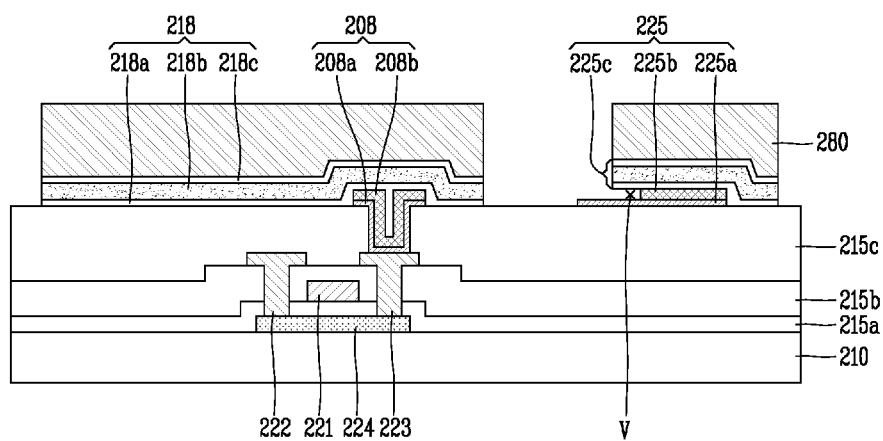

FIGS. 7A through 7C are cross-sectional views specifically illustrating a masking process illustrated in FIG. 6C.

As illustrated in FIG. 6A, a substrate 210 formed of an insulating material such as a transparent glass material, transparent plastic having excellent flexibility, or a polymer film is prepared.

Also, a TFT and a storage capacitor are formed in each of red, green, and blue subpixels of the substrate 210.

First, a buffer layer is formed on the substrate 210.

Here, the buffer layer may be formed to protect the TFT from impurities such as alkali ions leaked from the substrate 210 when a semiconductor layer is crystallized, and may be formed as a silicon oxide film.

Next, a semiconductor thin film, an insulating film, and a first conductive film (or a metal layer) are formed on the substrate 210 with the buffer layer formed thereon.

The semiconductor thin film may be formed of amorphous silicon, polycrystalline silicon, oxide semiconductor, or an organic semiconductor.

Here, the polycrystalline silicon may be formed using various crystallization methods after depositing amorphous silicon on the substrate 210. In the case of using oxide semiconductor as a semiconductor thin film, after the oxide semiconductor is deposited, a predetermined heat treatment process may be performed.

The first conductive film may be formed of a low resistant opaque conductive material such as aluminum (Al), copper (Cu), molybdenum (Mo), chromium (Cr), gold (Au), titanium (Ti), nickel (Ni), neodymium (Nd), or an alloy thereof. Here, the first conductive film may have a multilayer structure including two conductive films having different physical qualities. Also, one of the conductive films may be a metal of low resistivity to reduce a signal delay or a voltage drop. For example, one of the conductive films may be formed of an aluminum-based metal, a silver-based metal, or a copper-based metal.

Thereafter, the semiconductor thin film, the insulating film, and the first conductive film are selectively removed through a photolithography process to form a semiconductor layer 224 formed of the semiconductor thin film.

Here, a gate insulating film 215a formed of an insulating film is formed on the semiconductor layer 224.

A gate line including a gate electrode 221 formed of the first conductive film and a first storage electrode are formed on the gate insulating film 215a.

Thereafter, an inter-insulation film 215b formed of a silicon nitride film or a silicon oxide film is formed on the entire surface of the substrate 210 with the gate line including the gate electrode 221 and the first storage electrode formed thereon.

The inter-insulation film 215b is selectively patterned through a photolithography process to form a semiconductor layer contact hole exposing the source and drain regions of the semiconductor layer 224.

Thereafter, a second conductive film is formed on the entire surface of the substrate 210 with the inter-insulation film 215 formed thereon. Thereafter, the second conductive film is selectively removed through a photolithography to form data wirings (that is, source and drain electrodes 222 and 223), a driving voltage line, a data line, and a second storage electrode is formed of the second conductive film.

Here, in order to form the data wirings, the second conductive film may be of aluminum (Al), copper (Cu), molybdenum (Mo), chromium (Cr), gold (Au), titanium (Ti), nickel (Ni), neodymium (Nd), or an alloy thereof. Here, the second conductive film may have a multilayer structure including two conductive films having different physical qualities. Also, one of the conductive films may be a metal of low resistivity, for example, an aluminum-based metal, a silver-based metal, or a copper-based metal in order to reduce a signal delay or a voltage drop.

Here, the source and drain electrodes 222 and 223 are electrically connected to the source and drain regions of the semiconductor layer 224 through the semiconductor layer contact hole. Also, the second storage electrode overlaps a portion of the first storage electrode therebelow with the inter-insulation film 215*b* therebetween to form a storage capacitor.

Thereafter, a planarization film 215*c* formed of a silicon nitride film or a silicon oxide film is formed on the substrate 210 on which the source and drain electrodes 222 and 223, the driving voltage line, the data line, and the second storage electrode have been formed.

And then, the planarization film 215*c* is selectively patterned through a photolithography process to form a drain contact hole H exposing the drain electrode 223.

Thereafter, as illustrated in FIG. 6B, a third conductive film and a fourth conductive film are formed on the entire surface of the substrate 210 on which the planarization film 215*c* has been formed. Thereafter, the third conductive film and the fourth conductive film are selectively removed through a photolithography process to form a connection electrode 208 and an auxiliary electrode pattern 225' formed of the third conductive film and the fourth conductive film.

The connection electrode 208 may include a lower layer connection electrode 208*a* and an upper layer connection electrode 208*b* respectively formed of the third conductive film and the fourth conductive film of different kinds of metals having etching speeds different from the etching speed of the first electrode. Also, the auxiliary electrode pattern 225' may include a first auxiliary electrode pattern 225*a*' and a second auxiliary electrode pattern 225*b*' respectively formed of the third conductive film and the fourth conductive film having an etching speed different from the etching speed of the first electrode.

As described above, the etching speed of the third conductive film and the fourth conductive film constituting the connection electrode 208 and the auxiliary electrode pattern 225' are different with respect to an etchant used for patterning the upper layer auxiliary electrode, that is the first electrode.

For example, the third conductive film is formed of a metal which is not etched when the first electrode is patterned, such as MoTi or Ti, and is not damaged by the etchant of an Ag alloy. However, the present disclosure is not limited thereto and the third conductive film may be formed of a metal slowest in etching speed when the first electrode is patterned.

The fourth conductive film may be formed of a metal fastest in etching speed when the first electrode patterned. Here, the fourth conductive film is etched most quickly by the etchant of Ag alloy. Thus, the fourth conductive film is most etched, among the conductive films, to create a void V.

Thereafter, as illustrated in FIG. 6C, in order to form the void V, a masking process is performed. Cross-sectional views illustrated in FIGS. 7A through 7C specifically show the masking process.

As illustrated in FIG. 7A, a fifth conductive film 250, a sixth conductive film 260, and a seventh conductive film 270 are formed on the entire surface of the substrate 210 on which the connection electrode 208 and the auxiliary electrode patter 225' have been formed.

However, the present disclosure is not limited thereto and, for example, only a single layer of the fifth conductive film 250 may be formed on the entire surface of the substrate 210 on which the connection electrode 208 and the auxiliary electrode pattern 225' have been formed.

The fifth conductive film 250 and the seventh conductive film 270 may be formed of a transparent conductive material such as indium tin oxide (ITO) or indium zinc oxide (IZO).

The sixth conductive film 260 may be formed of aluminum (Al), silver (Ag), gold (Au), platinum (Pt), chromium (Cr), or an alloy thereof.

Thereafter, as illustrated in FIG. 7B, a photosensitive film pattern 280 formed of photoresist is formed on the substrate 210 with the seventh conductive film 270 formed thereon through a photolithography process.

Here, the photosensitive film pattern 280 may be patterned to overlap a portion of the auxiliary electrode pattern 225' therebelow, that is, not to overlap other portions of the auxiliary electrode pattern 225', and when the first electrode is patterned as described hereinafter, the portion of the second auxiliary electrode pattern 225*b*' which does not overlap the photosensitive film pattern is etched to secure the void.

In FIG. 7B, a case in which the photosensitive film pattern 280 is patterned not to overlap a left portion of the auxiliary electrode pattern 225' is illustrated as an example, but the present disclosure is not limited thereto. The photosensitive film pattern 280 may be patterned not to overlap a right portion of the auxiliary electrode pattern 225' or may be patterned not overlap left and right portions of the auxiliary electrode pattern 225'.

Thereafter, as illustrated in FIGS. 6C and 7C, the fifth conductive film, the sixth conductive film, and the seventh conductive film are selectively removed to form first electrodes 218 formed of the fifth conductive film, the sixth conductive film, and the seventh conductive film.

Here, the first electrodes 218 may include a lower layer first electrode 218*a*, a reflective layer 218*b*, and an upper layer first electrode 218*c* respectively formed of the fifth conductive film, the sixth conductive film, and the seventh conductive film.

For example, in a case in which the fifth conductive film, the sixth conductive film, and the seventh conductive film are formed of ITO/Ag alloy/ITO, when the ITO/Ag alloy/ITO is etched under the foregoing etch conditions, MoTi of the first auxiliary electrode pattern 225*a*' is not etched. Cu of the second auxiliary electrode pattern 225*b*' is etched faster than the ITO/Ag alloy/ITO, and thus, the auxiliary electrode 225 having the predetermined void V is patterned.

Here, in order to pattern the first electrode 218 formed of an Ag alloy, a phosphoric acid-based etchant, a nitric acid-based etchant, a phosphoric acid+nitric acid-based etchant, a phosphoric acid+acetic acid-based etchant, a nitric acid+acetic acid-based etchant, or a phosphoric acid+nitric acid+aetic acid-based etchant may be used. Also, as described above, MoTi cannot be etched with the etchant of Al alloy. Thus, when the ITO/Ag alloy/ITO is etched, MoTi of the first auxiliary electrode pattern 225*a*'' is not etched. Here, the auxiliary electrode 225 may include a lowermost layer auxiliary electrode 225*a* and a lower layer auxiliary electrode 225*b* respectively formed of the third conductive film and the fourth conductive film, for example, MoTi and Cu, and an upper layer auxiliary electrode 225*c* formed of the fifth conductive film, the sixth conductive film, and the seventh conductive film, for example, ITO/Ag alloy/ITO.

In this case, the first electrode 218 and the upper layer auxiliary electrode 225*c* are patterned according to a shape of the photosensitive film pattern, while the lowermost layer auxiliary electrode 225a is not etched. Also, since the lower layer auxiliary electrode 225b is etched at a faster pace than the upper layer auxiliary electrode 225c, a void V formed as the lower layer auxiliary electrode 225b has been etched is formed between the upper layer auxiliary electrode 225c and the lowermost layer auxiliary electrode 225a.

That is, one end portion of the upper layer auxiliary electrode 225c protrudes relative to one end portion of the lower layer auxiliary electrode 225b to form the void V, and one end portion of the lowermost layer auxiliary electrode 225a protrudes relative to one end portion of the lower layer auxiliary electrode 225b to form the void V.

For example, when the foregoing etchant of Ag alloy is used, in a case in which one end of the upper layer auxiliary electrode 225c is etched by about 0.5 µm to 2.0 µm, one end of the lower layer µm 225b may be etched by about 3.0 µm to 5.0 µm.

The first electrodes 218, an anode, are electrically connected to the drain electrode 223 of the driving TFT through the connection electrode 208.

Here, the first electrodes 218 are formed on the substrate 210 such that they correspond to the red, green, and blue subpixels.

Figure 6D:
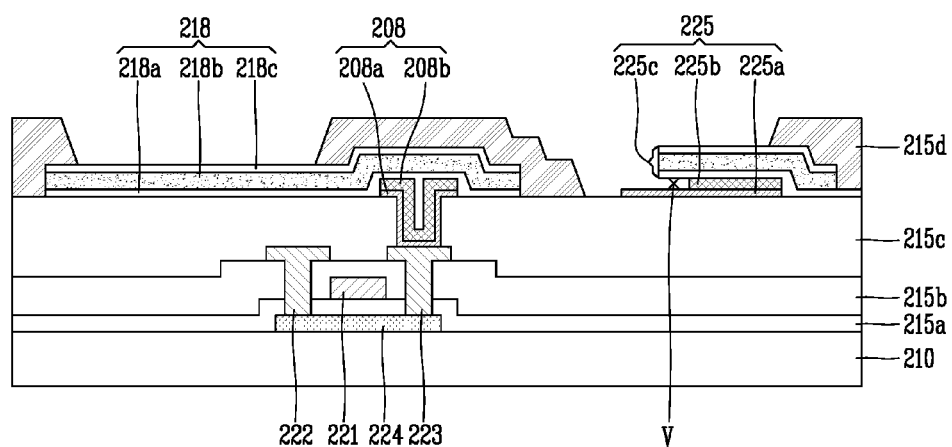

After the masking process, as illustrated in FIG. 6D, a predetermined bank 215d is formed on the substrate 210 on which the first electrodes 218 have been formed.

Here, the bank 215d may surround the periphery of the first electrode 218 to define a first opening, and may be formed of an organic insulating material or an inorganic insulating material. The bank 215d may also be formed of a photosensitizer including black pigment, and in this case, the bank 215d may serve as a light blocking member.

Figure 6E:
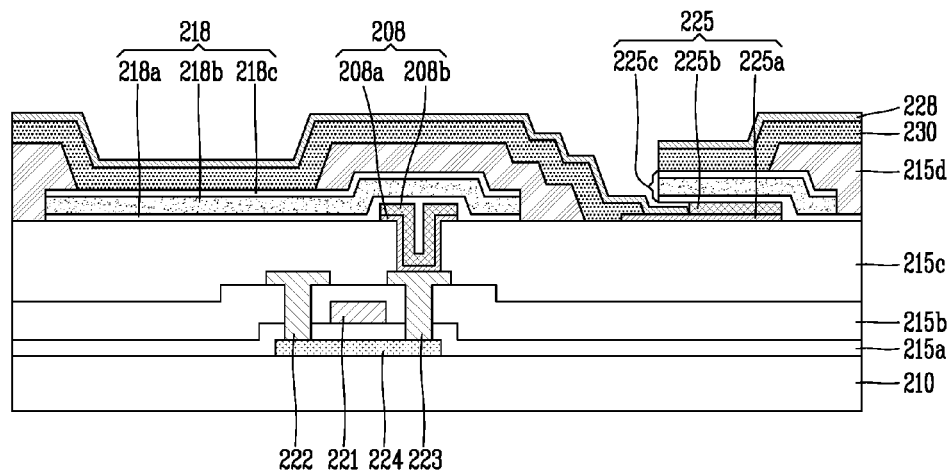

Also, as illustrated in FIG. 6E, an organic compound layer 230 is formed on the substrate 210 with the bank 215d formed thereon, through evaporation.

Here, the deposition through evaporation has straightness, and since the upper layer auxiliary electrode 225c serves as a light blocking film, the organic compound layer 230 is not deposited in the void V within the auxiliary electrode 225.

Here, to this end, first, a hole injection layer and a hole transport layer may be sequentially formed on the substrate 210.

Here, the hole injection layer and the hole transport layer may be commonly formed in the red, green, and blue subpixels to allow for smooth injection and transportation of holes. Here, any one of the hole injection layer and the hole transport layer may be omitted, or such functionality may be incorporated into one or more other layers.

Thereafter, an emission layer may be formed on the substrate 210 with the hole transport layer formed thereon.

Here, the emission layer may include a red emission layer, a green emission layer, and a blue emission layer to correspond to the red, green, and blue subpixels.

Thereafter, an electron transport layer may be formed on the substrate 210 with the emission layer formed thereon.

Here, the electron transport layer is commonly formed in the red, green, and blue subpixels above the emission layer to allow for smooth transportation of electrons.

Here, in order to allow electrons to be injected smoothly, an electron injection layer may be further formed above the electron transport layer.

A second electrode 228 formed of an eight conductive film is formed on the substrate 210 with the electron transport layer formed thereon, through sputtering.

Here, when the eighth conductive film is deposited through sputtering, since the eighth conductive film is also deposited even within the void V, the second electrode 228 and the auxiliary electrode 225 may be in contact in relatively large contact area.

Here, since the cathode is in contact with a side surface of the lower layer auxiliary electrode 225b, as well as with an upper surface of the lowermost layer auxiliary electrode 225a, contact reliability may be improved. Also, the second electrode 228 may be configured to be in contact with a rear surface of the protrusion portion of the upper layer auxiliary electrode 225c. A predetermined thin film encapsulation layer is formed on the OLED manufactured thusly to seal the OLED.

A polarization film may be provided on an upper surface of the thin film encapsulation layer to reduce reflection of external light of the organic light emitting display device to thus improve contrast.

Figure 8:
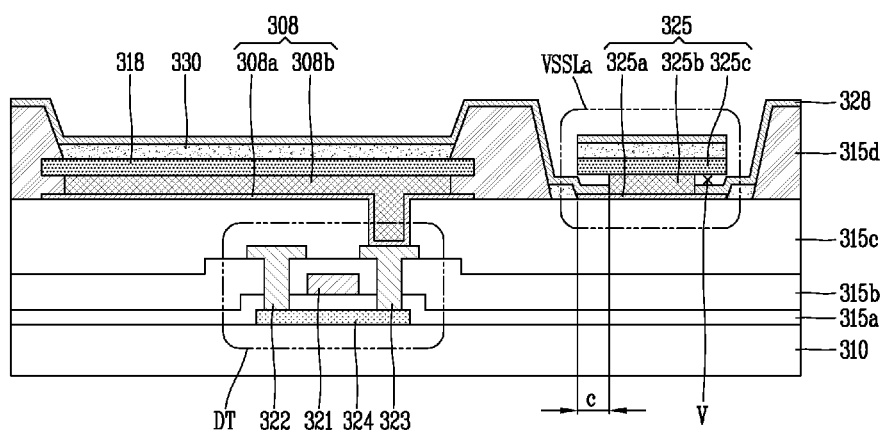
FIG. 8 is a cross-sectional view schematically illustrating a portion of a structure of an organic light emitting display device according to a third embodiment of the present disclosure.

FIG. 8 is a cross-sectional view schematically illustrating a portion of a structure of an organic light emitting display device according to a third embodiment of the present disclosure.

Here, the organic light emitting display device according to a third embodiment of the present disclosure illustrated in FIG. 8 has the substantially same configuration as that of the organic light emitting display device according to the second embodiment of the present disclosure described above, except that voids are formed on both sides of an auxiliary electrode and a connection electrode is patterned to have the substantially same shape as that of the first substrate.

FIG. 8 shows a top emission type organic light emitting display device using a TFT having a coplanar structure, as an example. However, the present disclosure is not limited thereto.

Referring to FIG. 8, the top emission type organic light emitting display device according to the third embodiment of the present disclosure may include a substrate 310, a driving TFT DT, an OLED, and an auxiliary electrode line VSSLa.

Like that of the first and second embodiments described above, the driving TFT DT according to the second embodiment includes a semiconductor layer 324, a gate electrode 321, a source electrode 322, and a drain electrode 323.

Here, a buffer layer may be further formed between the substrate 310 and the semiconductor layer 324.

A gate insulating layer 315a formed of a silicon nitride film (SiNx) or a silicon oxide film ($SiO_2$) is formed on the semiconductor layer 324. A gate line including the gate electrode 321 and a first storage electrode are formed on the gate insulating layer 315a.

An inter-insulation layer 315b formed of a silicon nitride film or a silicon oxide film is formed on the gate electrode 321, the gate line, and the first storage electrode. Also, a data line, a driving voltage line, source/drain electrodes 322 and 323, and a second storage electrode are formed on the inter-insulation layer 315b.

The source electrode 322 and the drain electrode 323 are formed to be spaced apart from one another and electrically connected to the semiconductor layer 324. Here, a semiconductor layer contact hole exposing the semiconductor layer 324 is formed in the gate insulating layer 315a and the inter-insulation layer 315b, and the source and drain electrodes 322 and 332 are electrically connected to the semiconductor layer 324 through the semiconductor layer contact hole.

Here, the second storage electrode overlaps a portion of the first storage electrode therebelow with the inter-insulation layer 315b interposed therebetween, forming a storage capacitor.

A planarization film 315c formed of a silicon nitride film or a silicon oxide film is formed on the substrate 310 on which the data line, the driving voltage line, the source and drain electrodes 322 and 323, and the second storage electrode have been formed.

The OLED may include a first electrode 318, an organic compound layer 330, and a second electrode 328.

The OLED is electrically connected to the driving TFT DT. In detail, a drain contact hole exposing the drain electrode 323 of the driving TFT DT is formed in the planarization film 315c formed on the driving TFT DT. The OLED is electrically connected to the drain electrode 323 of the driving TFT DT through the drain contact hole.

That is, the first electrode 318 is formed on the planarization film 315c, and electrically connected to the drain electrode 323 of the driving TFT DT through a connection electrode 308 and the drain contact hole.

The first electrode 318 supplies a current (or a voltage) to the organic compound layer 330, which defines a light emitting region having a predetermined area. Also, the first electrode 318 serves as an anode. Thus, the first electrode 318 may include a transparent conductive material having a relatively large work function. For example, the first electrode 318 may include upper and lower layer first electrodes formed of indium tin oxide (ITO) or indium zinc oxide (IZO). In order to enhance reflection efficiency, the first electrode 318 may further include a reflective layer formed of a metal having high reflection efficiency in a lower portion thereof. For example, the metal having high reflection efficiency may include aluminum (Al), silver (Ag), gold (Au), platinum (Pt), chromium (Cr), or an alloy thereof.

Here, in FIG. 8, for the purposes of description, the first electrode 318 is illustrated without distinguishing between the upper and lower layer first electrodes and the reflective layer.

The first electrode 318 according to the third embodiment of the present disclosure may have a triple-layer structure including the upper and lower layer first electrodes and the reflective layer between the upper layer first electrode and the lower layer first electrode. However, the present disclosure is not limited thereto.

A bank 315d is formed on the substrate 310 with the first electrode 318 formed thereon. Here, the bank 315d may surround the periphery of the first electrode 318 to define a first opening, and may be formed of an organic insulating material or an inorganic insulating material. The bank 315d may also be formed of a photosensitizer including black pigment, and in this case, the bank 315d may serve as a light blocking member.

Here, in the third embodiment of the present disclosure, the bank 315d may further include a second opening exposing a portion of an auxiliary electrode 325 (to be described hereinafter).

Here, the auxiliary electrode 325 according to the third embodiment of the present disclosure includes upper and lower layer auxiliary electrodes 325c and 325b, and the lowermost auxiliary electrode 325a. Here, the upper and lower layer auxiliary electrodes 325b and 325a of different kinds of metals having different etching speed (or etch rate) with respect to an etchant of the first electrode 318. Also, when the second electrode 328 is deposited, the second electrode 328 is in contact with the auxiliary electrode 325 itself.

However, the present disclosure is not limited thereto and the auxiliary electrode 325 according to the third embodiment of the present disclosure may have at least two or more layers including the upper and lower auxiliary electrodes 325c and 325b of different kinds of metals, and the lower auxiliary electrode 325b may be disposed at an inner side, relative to the upper layer auxiliary electrode 325c.

To this end, the upper and lower and the lowermost auxiliary electrodes 325c, 325b, and 325a are formed of a minimum of three or more metals, and etching speed (or etch rate) of the metals forming the lower layer and the lowermost layer auxiliary electrodes 325b and 325c are different with respect to an etchant used for patterning the upper layer auxiliary electrode 325c and the first electrode 318.

That is, the lowermost auxiliary electrode 325a may be formed of a metal not etched when the first electrode 318 is patterned, like MoTi or Ti. For example, the lowermost auxiliary electrode 325a may be formed of a metal without damaging an etchant of an Ag alloy. However, as mentioned above, the present disclosure is not limited thereto and the lowermost auxiliary electrode 325a may be formed of a metal which may be etched at the slowest pace when the first electrode 318 is patterned.

In order to pattern the first electrode 318 formed of an Ag alloy, a phosphoric acid-based etchant, a nitric acid-based etchant, a phosphoric acid+nitric acid-based etchant, a phosphoric acid+acetic acid-based etchant, a nitric acid+acetic acid-based etchant, or a phosphoric acid+nitric acid+aetic acid-based etchant may be used.

The lower layer auxiliary electrode 325b is formed of a metal which is etched at the fastest pace (or which has the highest etch rate), like copper (Cu), and thus, the lower layer auxiliary electrode 325b is etched by the etchant of Ag alloy most quickly.

The upper layer auxiliary electrode 325c may have the same single layer or triple-layer structure as that of the first electrode 318, and may be patterned at the same etching speed when the first electrode 318 is patterned. For example, metal layers constituting the upper layer auxiliary electrode 326c may include at least one of ITO, Ag, an Ag alloy, and MoTi.

Under the aforementioned etch conditions, when the ITO/Ag alloy/ITO is etched, MoTi of the lowermost layer auxiliary electrode 325a is rarely etched, while Cu of the lower layer auxiliary electrode 325b is etched faster than ITO/Ag alloy/ITO. Also, the ITO/Ag alloy/ITO of the upper layer auxiliary electrode 325c is etched at the same speed as that of the first electrode 318, forming a predetermined void V within the auxiliary electrode 325.

Here, in the third embodiment of the present disclosure, voids V may be formed on both sides of the auxiliary electrode 325, and in this case, contact reliability may be further enhanced, compared with the second embodiment. That is, both end portions of the upper layer auxiliary electrode 325c protrude further than the both end portions of the lower layer auxiliary electrode 3235b to form the void V, and both end portions of the lowermost layer auxiliary electrode 325a protrude further than both end portions of the lower auxiliary electrode 325b to form the void V.

The auxiliary electrode 325 may have a multi-taper shape, and in particular, the auxiliary electrode 325 may be formed to have a multi-taper shape by introducing a sacrificial layer to a lower end portion of the auxiliary electrode 325.

When the organic compound layer 330 is deposited through evaporation in a follow-up process, the organic compound layer 330 is not deposited within the void V. Meanwhile, when a metal for the second electrode 328 is deposited through sputtering, the metal for the second electrode 328 is deposited within both voids V to have a relatively large contact region (c), and the second electrode 328 is in contact with the auxiliary electrode 325.

In particular, since the upper layer auxiliary electrode 325c serves as a blocking film, the organic compound layer 330 is not deposited in the void W within the auxiliary electrode 325.

The dual-layer structure of CuMoTi in the multi-layer structure of the auxiliary electrode 325 may also be applied to the connection electrode 308 and a pad electrode. Thus, the connection electrode 308 may include upper and lower layer connection electrodes 308b and 308a Here, the connection electrode 308 may be formed across the entire light emitting region substantially in the same form as that of the first electrode 318.

In this manner, according to the third embodiment of the present disclosure, when the first electrode 318 is patterned, the void V is formed within the auxiliary electrode 325 due to the differences in etching speed (or etch rate) of the upper and lower layer and the lowermost layer auxiliary electrodes 325c, 325b, and 325a, and thus, the second electrode 328 and the auxiliary electrode 325 may be in direct contact in a relatively large contact region (c). In particular, since the side surface of the lower layer auxiliary electrode 325b, as well as the surface of the lowermost layer auxiliary electrode 325a, is used as the contact region (c) and since the contact regions (c) are present on both sides of the auxiliary electrode 325, reliability of contact may be enhanced. Also, the second electrode 328 may be configured to be in contact with a rear surface of the protrusion portion of the upper layer auxiliary electrode 325c.

Also, unlike that of the first embodiment of the present disclosure, in the organic light emitting display device according to the third embodiment of the present disclosure, the second electrode 328 and the auxiliary electrode 325 are in direct contact with each other, and thus, the number of masks may be reduced.

Like those of the first and second embodiments of the present disclosure described above, the organic compound layer 330 is formed between the first electrode 318 and the second electrode 328. The organic compound layer 330 emits light according to combination of holes supplied from the first electrode 318 and electrons supplied from the second electrode 328.

Here, FIG. 8 illustrates a case in which the organic compound layer 330 is formed on the entire surface of the substrate 310, but the present disclosure is not limited thereto. The organic compound layer 330 may be formed only on the first electrode 318.

The organic compound layer 330 may have a multilayer structure including an auxiliary layer for enhancing luminous efficiency of the emission layer, in addition to the emission layer emitting light.

The second electrode 328 is formed on the organic compound layer 330 to provide electrons to the organic compound layer 330.

The second electrode 328 serves as a cathode. Thus, the second electrode 328 may be formed of a transparent conductive material. For example, the transparent conductive material may include indium tin oxide (ITO) or indium zinc oxide (IZO). The second electrode 328 may further include a thin metal film (not shown) formed of a metal having a low work function in a portion thereof in contact with the organic compound layer 330. For example, the metal having a low work function may include magnesium (Mg), silver (Ag), and a compound thereof.

Hereinafter, a method for manufacturing the light emitting display device according to the third embodiment of the present disclosure configured described above will be described in detail with reference to the accompanying drawings.

FIGS. 9A through 9E are cross-sectional views sequentially illustrating a method of manufacturing an organic light emitting display device according to the third embodiment of the present disclosure illustrated in FIG. 8.

Figure 10A:
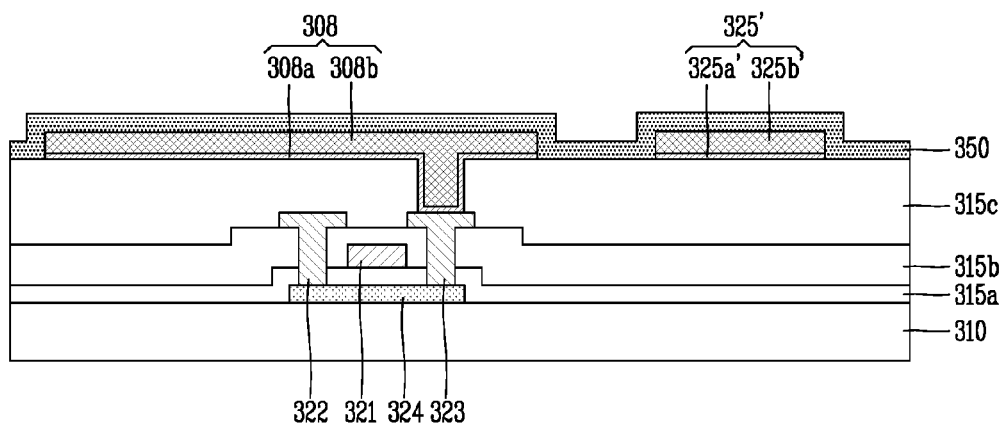
FIGS. 10A through 10C are cross-sectional views specifically illustrating a masking process illustrated in FIG. 9C.
Figure 10B:
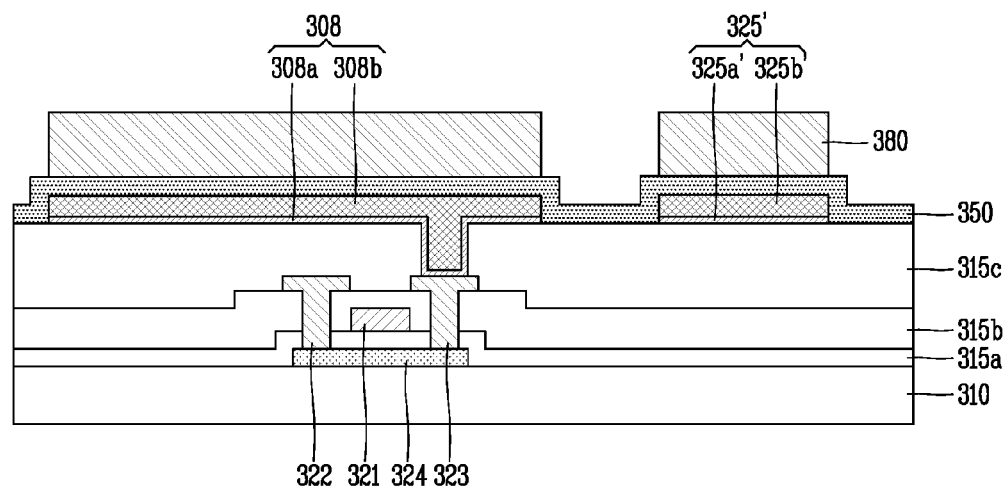
Figure 10C:
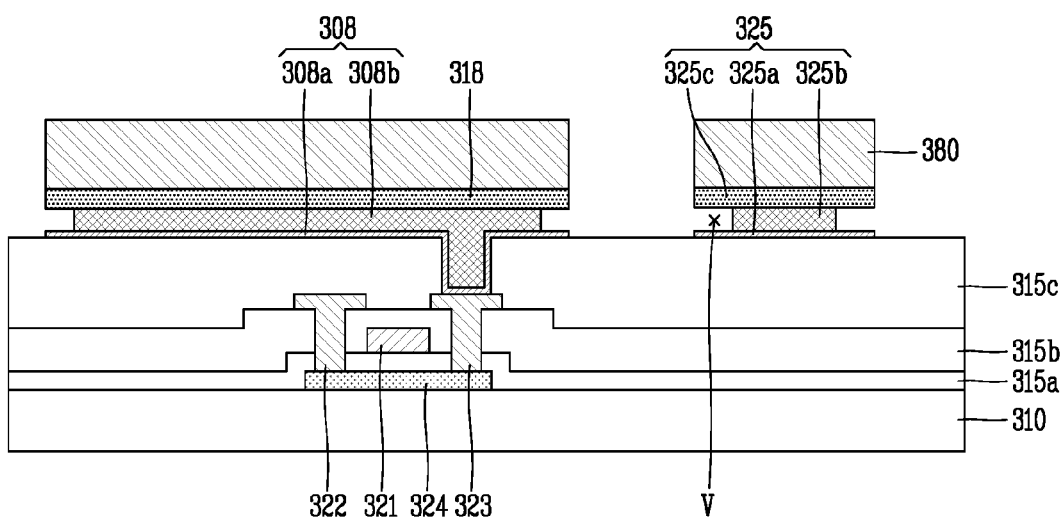

FIGS. 10A through 10C are cross-sectional views specifically illustrating a masking process illustrated in FIG. 6C.

As illustrated in FIG. 10A, a substrate 310 formed of an insulating material such as a transparent glass material, transparent plastic having excellent flexibility, or a polymer film is prepared.

Also, a TFT and a storage capacitor are formed in each of red, green, and blue subpixels of the substrate 310.

As described above, a semiconductor layer 324 formed of a semiconductor thin film is formed on the substrate 310.

Here, a gate insulating film 315a formed of an insulating film is formed on the semiconductor layer 324.

A gate line including a gate electrode 321 formed of the first conductive film and a first storage electrode are formed on the gate insulating film 315a.

Thereafter, an inter-insulation film 315b formed of a silicon nitride film or a silicon oxide film is formed on the entire surface of the substrate 310 with the gate line including the gate electrode 321 and the first storage electrode formed thereon.

The inter-insulation film 315b is selectively patterned through a photolithography process to form a semiconductor layer contact hole exposing the source and drain regions of the semiconductor layer 324.

Thereafter, a second conductive film is formed on the entire surface of the substrate 310 with the inter-insulation film 315 formed thereon. Thereafter, the second conductive film is selectively removed through a photolithography to form data wirings (that is, source and drain electrodes 322 and 323), a driving voltage line, a data line, and a second storage electrode formed of the second conductive film.

Here, the source and drain electrodes 322 and 323 are electrically connected to the source and drain regions of the semiconductor layer 324 through the semiconductor layer contact hole. Also, the second storage electrode overlaps a portion of the first storage electrode therebelow with the inter-insulation film 315b therebetween to form a storage capacitor.

Thereafter, a planarization film 315c formed of a silicon nitride film or a silicon oxide film is formed on the substrate 310 on which the source and drain electrodes 322 and 323, the driving voltage line, the data line, and the second storage electrode have been formed.

And then, the planarization film 315c is selectively patterned through a photolithography process to form a drain contact hole H exposing the drain electrode 323.

Figure 9A:
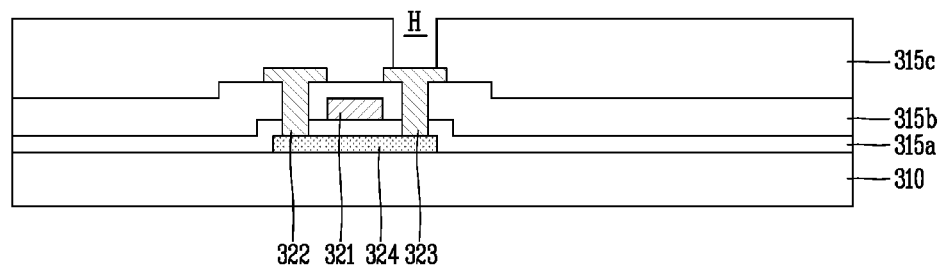
FIGS. 9A through 9E are cross-sectional views sequentially illustrating a method of manufacturing an organic light emitting display device according to the third embodiment of the present disclosure illustrated in FIG. 8.
Figure 9B:
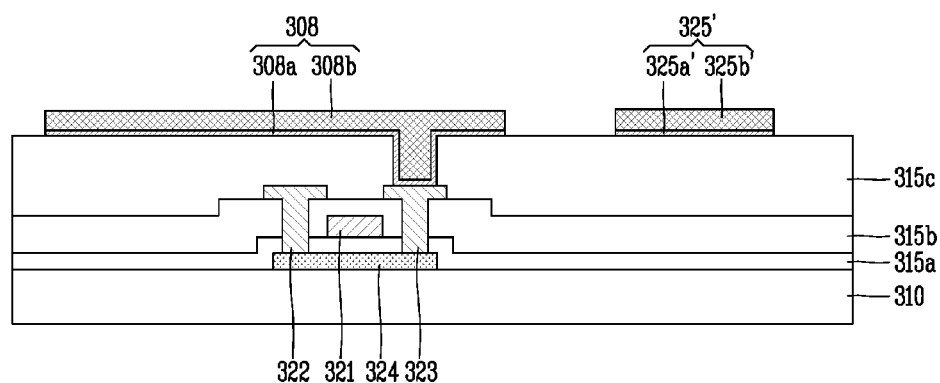

Thereafter, as illustrated in FIG. 9B, a third conduct film and a fourth conductive film are formed on the entire surface of the substrate 310 on which the planarization film 315c has been formed. Thereafter, the third conductive film and the fourth conductive film are selectively removed through a photolithography process to form a connection electrode 308 and an auxiliary electrode pattern 325' formed of the third conductive film and the fourth conductive film.

The connection electrode 308 may include a lower layer connection electrode 308a and an upper layer connection electrode 308b respectively formed of the third conductive film and the fourth conductive film of different kinds of metals having a selective etching speed with respect to the first electrode.

Also, the auxiliary electrode pattern 325' may include a first auxiliary electrode pattern 325a' and a second auxiliary electrode pattern 325b' respectively formed of the third conductive film and the fourth conductive film having etching speed (or etch rate) different from that of the first electrode.

As described above, the etching speed (or etch rate) of the third conductive film and the fourth conductive film constituting the connection electrode 308 and the auxiliary electrode pattern 325' are different with respect to an etchant used for patterning the upper layer auxiliary electrode, that is the first electrode.

For example, the third conductive film is formed of a metal which is not etched when the first electrode is patterned, such as MoTi or Ti, and is not damaged by the etchant of an Ag alloy. However, the present disclosure is not limited thereto and the third conductive film may be formed of a metal slowest in etching speed when the first electrode is patterned.

The fourth conductive film may be formed of a metal fastest in etching speed when the first electrode patterned. Thus, the fourth conductive film is etched most quickly by the etchant of Ag alloy. Thus, the fourth conductive film is most etched, among the conductive films, to from a void V.

Figure 9C:
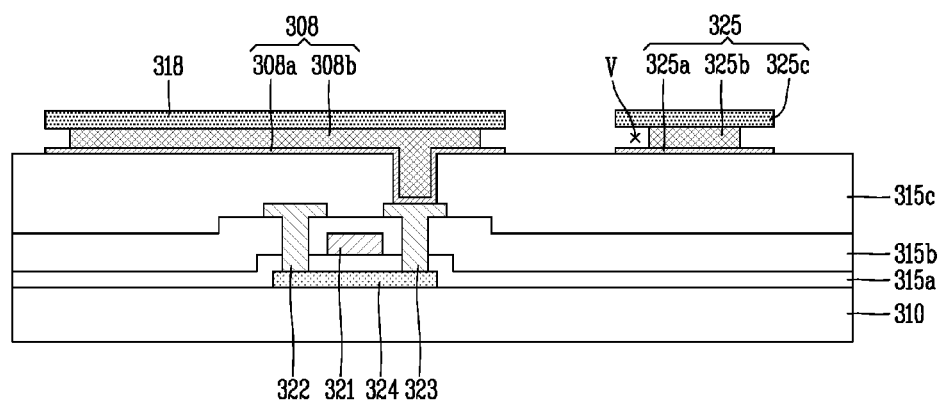

Thereafter, as illustrated in FIG. 9C, in order to form the void V, a masking process is performed. Cross-sectional views illustrated in FIGS. 10A through 10C specifically show the masking process.

As illustrated in FIG. 10A, a fifth conductive film 350 is formed on the entire surface of the substrate 310 on which the connection electrode 308 and the auxiliary electrode patter 325' have been formed.

The fifth conductive film 350 may include three layers, i.e., upper and lower layers formed of a transparent conductive material such as indium tin oxide (ITO) or indium zinc oxide (IZO) and a reflective layer formed of aluminum (Al), silver (Ag), gold (Au), platinum (Pt), chromium (Cr), or an alloy thereof between the upper and lower layers. In FIG. 10A, for the purposes of description, the fifth conductive film 350 is illustrated as a single layer.

However, the present disclosure is not limited thereto and the fifth conductive film 350 may be formed as a single layer or multiple layers including two or four layers.

Thereafter, as illustrated in FIG. 10B, a predetermined photosensitive film pattern 380 formed of photoresist is formed on the substrate 310 with the fifth conductive film 350 formed thereon through a photolithography process.

Here, a portion of the photosensitive film pattern 380, namely, a region in which an auxiliary electrode is to be formed, is patterned to have the substantially same shape as that of the auxiliary electrode pattern 325' therebelow.

Thereafter, as illustrated in FIGS. 9C and 10C, the fifth conductive film is selectively removed to form first electrodes 318 formed of the fifth conductive film.

Here, as mentioned above, the first electrodes 318 may include a lower layer first electrode 318a, a reflective layer, and an upper layer first electrode formed of the fifth conductive film.

For example, in a case in which the fifth conductive film is formed of ITO/Ag alloy/ITO, when the ITO/Ag alloy/ITO is etched under the foregoing etch conditions, MoTi of the first auxiliary electrode pattern 325a' is not etched. Cu of the second auxiliary electrode pattern 325b' is etched at a pace faster than that of ITO/Ag alloy/ITO, and thus, the auxiliary electrode 325 having the predetermined void V is patterned.

Here, In order to pattern the first electrode 318 formed of an Ag alloy, a phosphoric acid-based etchant, a nitric acid-based etchant, a phosphoric acid+nitric acid-based etchant, a phosphoric acid+acetic acid-based etchant, a nitric acid+acetic acid-based etchant, or a phosphoric acid+nitric acid+aetic acid-based etchant may be used. Also, as described above, MoTi cannot be etched with the etchant of Al alloy. Thus, when the ITO/Ag alloy/ITO is etched, MoTi of the first auxiliary electrode pattern 325a'' is not etched.

Here, the auxiliary electrode 325 may include a lowermost layer auxiliary electrode 325a and a lower layer auxiliary electrode 325b respectively formed of the third conductive film and the fourth conductive film, for example, MoTi and Cu, and an upper layer auxiliary electrode 325c formed of the fifth conductive film, for example, ITO/Ag alloy/ITO.

In this case, the first electrode 318 and the upper layer auxiliary electrode 325c are patterned according to a shape of the photosensitive film pattern, while the lowermost layer auxiliary electrode 325a is not etched. Also, since the lower layer auxiliary electrode 325b is etched at a faster pace than the upper layer auxiliary electrode 325c, a pair of voids V formed as the lower layer auxiliary electrode 325b has been etched are formed between the upper layer auxiliary electrode 325c and the lowermost layer auxiliary electrode 325a.

That is, both end portions of the upper layer auxiliary electrode 325c protrude relative to both end portions of the lower layer auxiliary electrode 325b to from the void V, and both end portions of the lowermost layer auxiliary electrode 325a protrude relative to both end portions of the lower layer auxiliary electrode 325b to form the voids V.

For example, when the foregoing etchant of Ag alloy is used, in a case in which one end of the upper layer auxiliary electrode 325c is etched by about 0.5 μm to 3.0 μm, one end of the lower layer μm 325b may be etched by about 3.0 μm to 5.0 μm.

The first electrodes 318, an anode, are electrically connected to the drain electrode 323 of the driving TFT through the connection electrode 308.

Here, the first electrodes 318 are formed on the substrate 310 such that they correspond to the red, green, and blue subpixels.

Figure 9D:
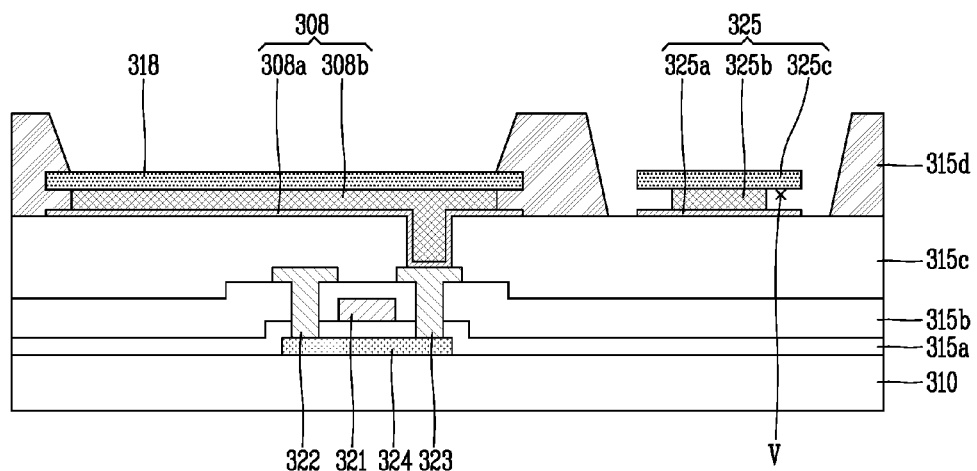

Thereafter, as illustrated in FIG. 9D, a predetermined bank 315d is formed on the substrate 310 on which the first electrodes 318 have been formed.

Figure 9E:
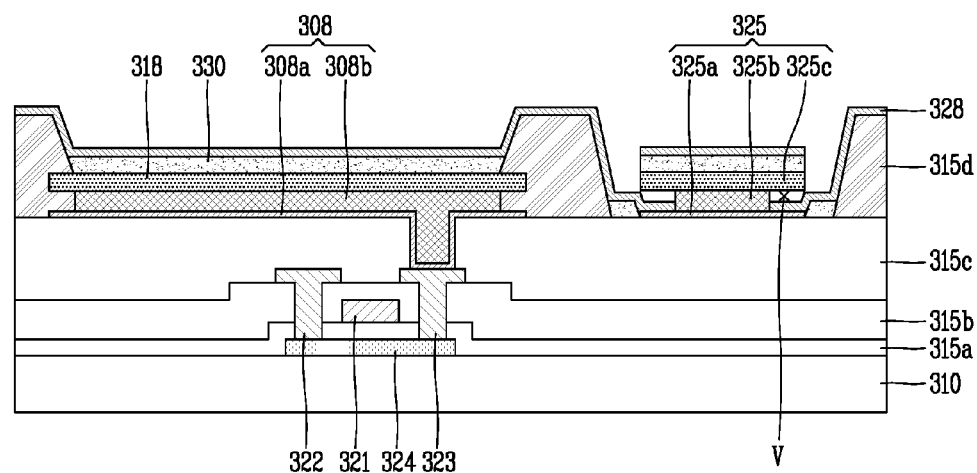

Also, as illustrated in FIG. 9E, an organic compound layer 330 is formed on the substrate 310 with the bank 315d formed thereon, through evaporation.

Here, the deposition through evaporation has straightness, and since the upper layer auxiliary electrode 325c serves as a light blocking film, the organic compound layer 330 is not deposited in the void V within the auxiliary electrode 325.

Thereafter, a second electrode 328 formed of the sixth conductive film is formed on the substrate 310 with the organic compound layer 330 formed thereon though sputtering.

Here, when the sixth conductive film is deposited through sputtering, since the sixth conductive film is also deposited within the pair of voids V, the second electrode 328 and the auxiliary electrode 325 are in contact in a relative large area.

Here, since the cathode is in contact with the side surface of the lower layer auxiliary electrode 325b, as well as with an upper surface of the lowermost layer auxiliary electrode 325a, and since the cathode is in contact with both sides of the auxiliary electrode 325, contact reliability may be enhanced. Also, the second electrode 328 may be configured to be in contact with a rear surface of the protrusion portion of the upper layer auxiliary electrode 325c.

A predetermined thin film encapsulation layer is formed on the OLED manufactured thusly to seal the OLED.

A polarization film may be provided on an upper surface of the thin film encapsulation layer to reduce reflection of external light of the organic light emitting display device to thus enhance contrast.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An organic light emitting display device comprising:
a first electrode disposed in each of a plurality of subpixels of a substrate;
a driving thin film transistor (TFT) and a connection electrode disposed below the first electrode, the connection electrode to connect the first electrode to a drain electrode of the driving TFT;
an auxiliary electrode spaced apart from the first electrode and having a void formed by at least upper, lower, and lowermost layers having different etching speeds from each other;
a bank surrounding a periphery of the first electrode and exposing a portion of the auxiliary electrode; and
a second electrode in direct contact with the auxiliary electrode at the void,
wherein the lower and lowermost layers have different etching speeds from that of the first electrode, and
wherein differences in protruding amounts among end portions of the upper, lower, and lowermost layers result in the void due to the different etching speeds.

2. The organic light emitting display device of claim 1, wherein, in the auxiliary electrode, an etching speed of the upper layer is lower than that of the lower layer such that one end portion of the upper layer protrudes relative to a corresponding one end portion of the lower layer to form the void.

3. The organic light emitting display device of claim 2, wherein the upper layer and the first electrode include at least one of ITO, Ag, Ag alloy, or MoTi.

4. The organic light emitting display device of claim 2, wherein the lower layer includes Cu and the lowermost layer includes Mo or MoTi.

5. The organic light emitting display device of claim 2, wherein at least one end portion of the lowermost layer protrudes, relative to at least the one end portion of the upper layer to form the void.

6. The organic light emitting display device of claim 5, wherein the second electrode is in direct contact with an upper surface of the lowermost layer and the one end portion of the lower layer.

7. The organic light emitting display device of claim 1, wherein in the auxiliary electrode, an etching speed of the upper layer is same as that of the first electrode and an etching speed of the lower and lowermost layers are the same as that of the connection electrode.

8. The organic light emitting display device of claim 7, wherein the connection electrode is coupled with a horizontal surface of the first electrode.

9. An organic light emitting display device comprising:
a first electrode disposed in each of a plurality of subpixels of a substrate;
an auxiliary electrode spaced apart from the first electrode and including at least two layers, wherein an end portion of at least one layer below an uppermost layer of the at least two layers is receded relative to an end portion of the uppermost layer to form a void;
an organic layer on the first electrode and the upper layer;
a second electrode on the organic layer and connected to the at least one layer; and
a connection electrode formed below the first electrode and made of same materials as two lowest metal layers of the at least two metal layers, wherein the connection electrode is in direct contact with a lower surface of the first electrode.

10. The organic light emitting display device of claim 9, wherein an etching speed of the uppermost layer is slower than that of the at least one layer below the uppermost layer of the at least two layers.

11. The organic light emitting display device of claim 10, wherein the auxiliary electrode further includes a lowermost layer below the at least one layer, wherein an end portion of the lowermost layer protrudes from the end portion of the uppermost layer.

12. The organic light emitting display device of claim 11, wherein an etching speed of the at least one layer is faster than an etching speed of the uppermost layer and the lowermost layer.

13. A method for manufacturing an organic light emitting display device, the method comprising:
forming a driving thin film transistor (TFT) on a substrate;
forming a connection electrode and an auxiliary electrode pattern including at least two different metal layers on the substrate;
patterning a first electrode on the substrate with the connection electrode and the auxiliary electrode pattern formed thereon, wherein the auxiliary electrode pattern is etched to form the auxiliary electrode including the at least two different metal layers;
forming a bank surrounding a periphery of the first electrode and exposing a portion of the auxiliary electrode;
forming an organic layer on the first electrode, the auxiliary electrode, and the bank;
forming a second electrode on the organic layer,
wherein an end portion of at least one metal layer formed on a lowermost layer of the at least two metal layers is receded relative to an end portion of the uppermost layer of the at least two metal layers to form a void, and
wherein the second electrode and the auxiliary electrode are in direct contact with each other through the void.

14. The method of claim 13, wherein the second electrode is formed to be in direct contact with an upper surface of the lowermost layer and a side surface of the at least one metal layer.

15. The method of claim 13, wherein the patterning step that forms the auxiliary electrode pattern into the auxiliary electrode results in the auxiliary electrode having a same at least two different metal layers structure as that of the connection electrode.

* * * * *